United States Patent
Yuan et al.

(10) Patent No.: US 8,969,199 B1
(45) Date of Patent: Mar. 3, 2015

(54) METHODS OF FORMING A CIRCUIT THAT INCLUDES A CROSS-COUPLING GATE CONTACT STRUCTURE WHEREIN THE CIRCUIT IS TO BE MANUFACTURED USING A TRIPLE PATTERNING PROCESS

(71) Applicant: Globalfoundries Inc., Grand Cayman (KY)

(72) Inventors: Lei Yuan, Cupertino, CA (US); Jason Eugene Stephens, Cohoes, NY (US); Li Yang, San Jose, CA (US); Soo Han Choi, Pleasanton, CA (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 14/054,251

(22) Filed: Oct. 15, 2013

(51) Int. Cl.
*H01L 21/312* (2006.01)
*H01L 21/033* (2006.01)
*H01L 21/768* (2006.01)

(52) U.S. Cl.
CPC ...... *H01L 21/0334* (2013.01); *H01L 21/76877* (2013.01)
USPC .......................................................... 438/666

(58) Field of Classification Search
CPC ............ H01L 21/0337; H01L 21/0338; H01L 27/0207; G05B 2219/31265; G05B 2219/45031
See application file for complete search history.

(56) References Cited

U.S. PATENT DOCUMENTS

| | | | |
|---|---|---|---|
| 2009/0087754 A1* | 4/2009 | Aton ................................. 430/5 |
| 2010/0130016 A1* | 5/2010 | DeVilliers ..................... 438/703 |
| 2012/0217551 A1* | 8/2012 | Daly et al. .................... 257/285 |
| 2012/0217588 A1* | 8/2012 | Vega ............................. 257/408 |
| 2013/0095662 A1* | 4/2013 | Liu et al. ....................... 438/694 |

* cited by examiner

*Primary Examiner* — Brett Feeney
*Assistant Examiner* — James Chin
(74) *Attorney, Agent, or Firm* — Amerson Law Firm, PLLC

(57) ABSTRACT

One illustrative method disclosed herein includes, among other things, patterning a hard mask layer using three patterned photoresist etch masks, wherein a first feature corresponding to a portion, but not all, of a cross-coupling gate contact structure is present in a first of the three patterned photoresist etch masks and a second feature corresponding to a portion, but not all, of the cross-coupling gate contact structure is present in a second or a third of the three patterned photoresist etch masks, patterning a layer of insulating material using the patterned hard mask layer as an etch mask, and forming a cross-coupling gate contact structure in a trench in the layer of insulating material.

19 Claims, 20 Drawing Sheets

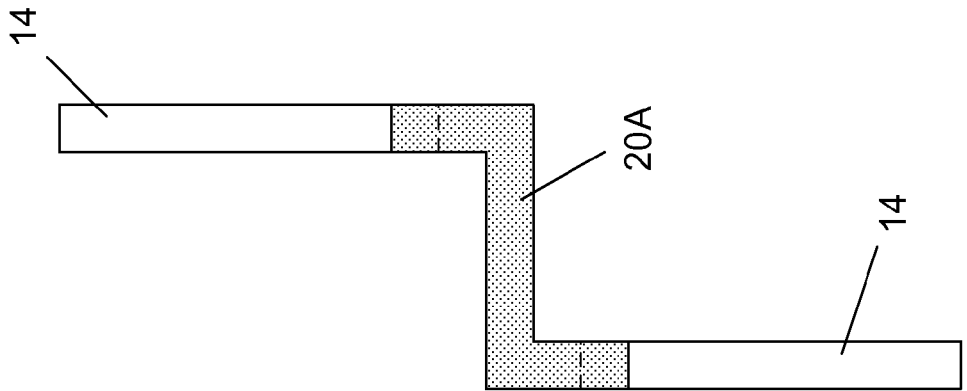
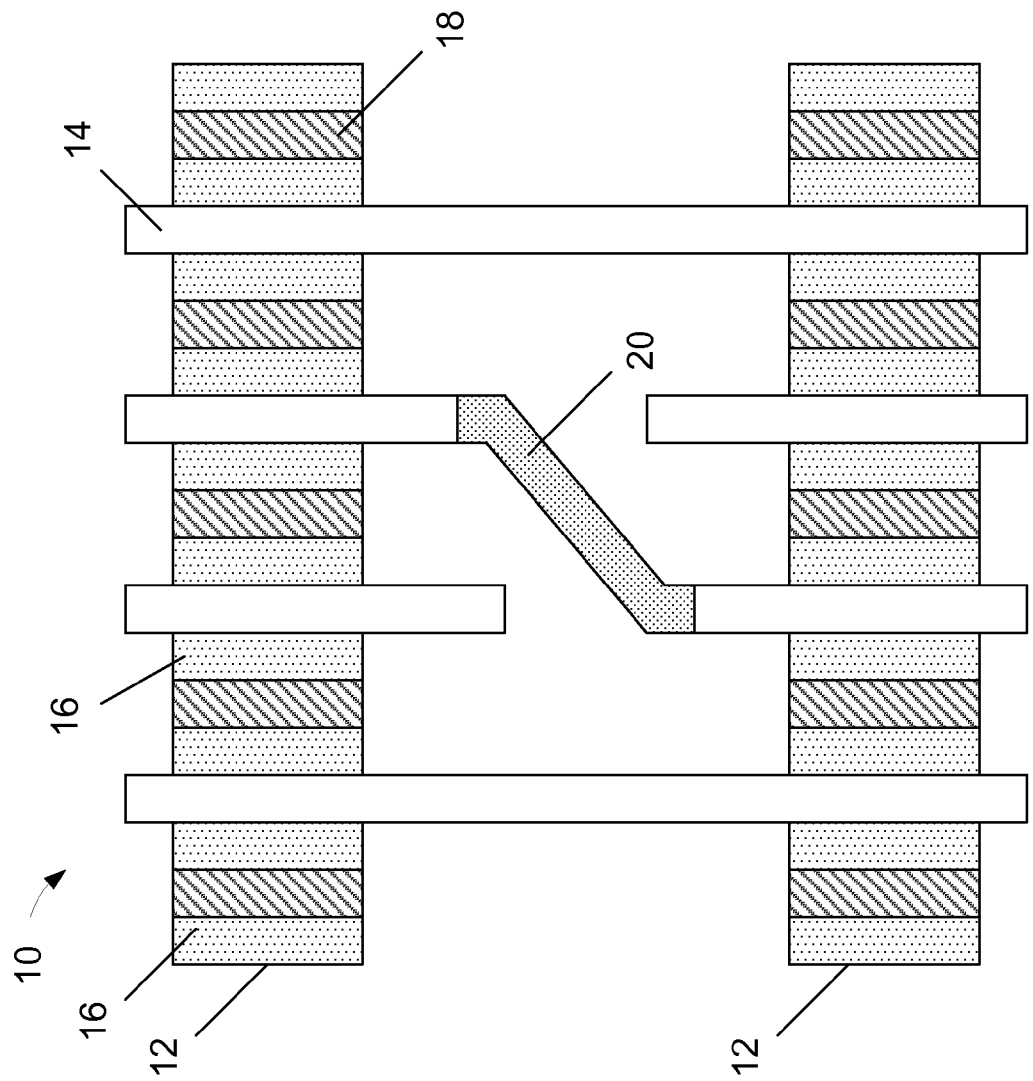

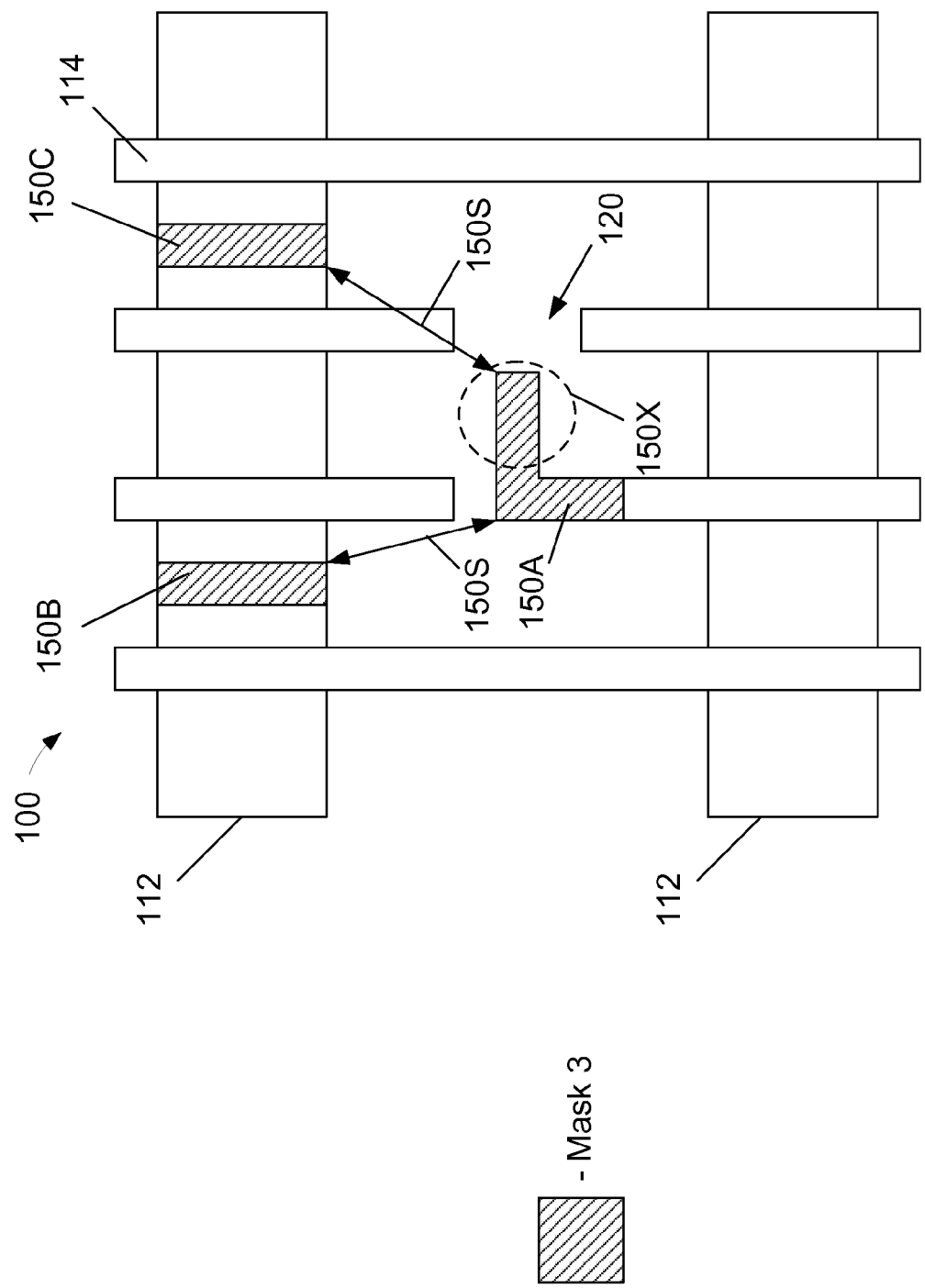

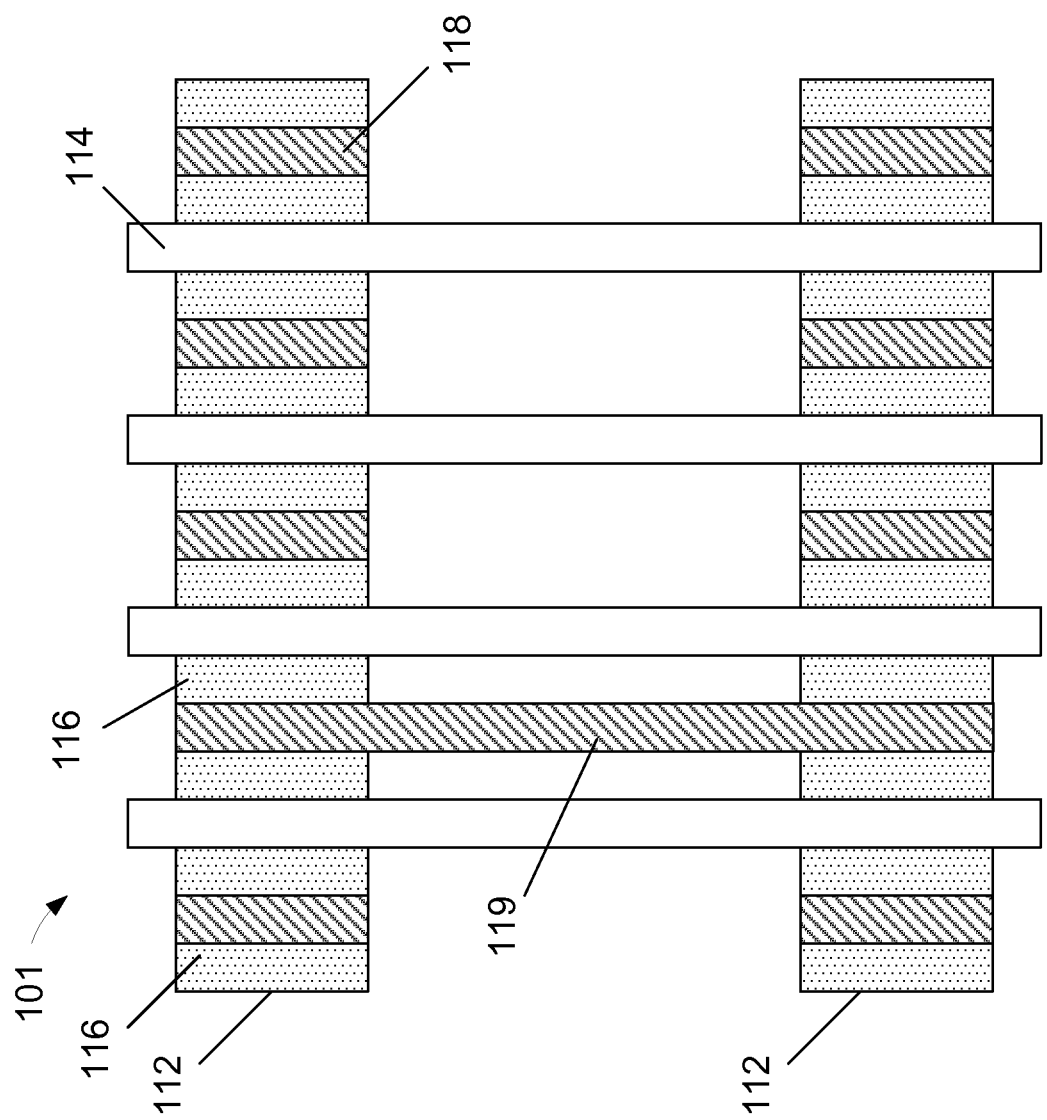

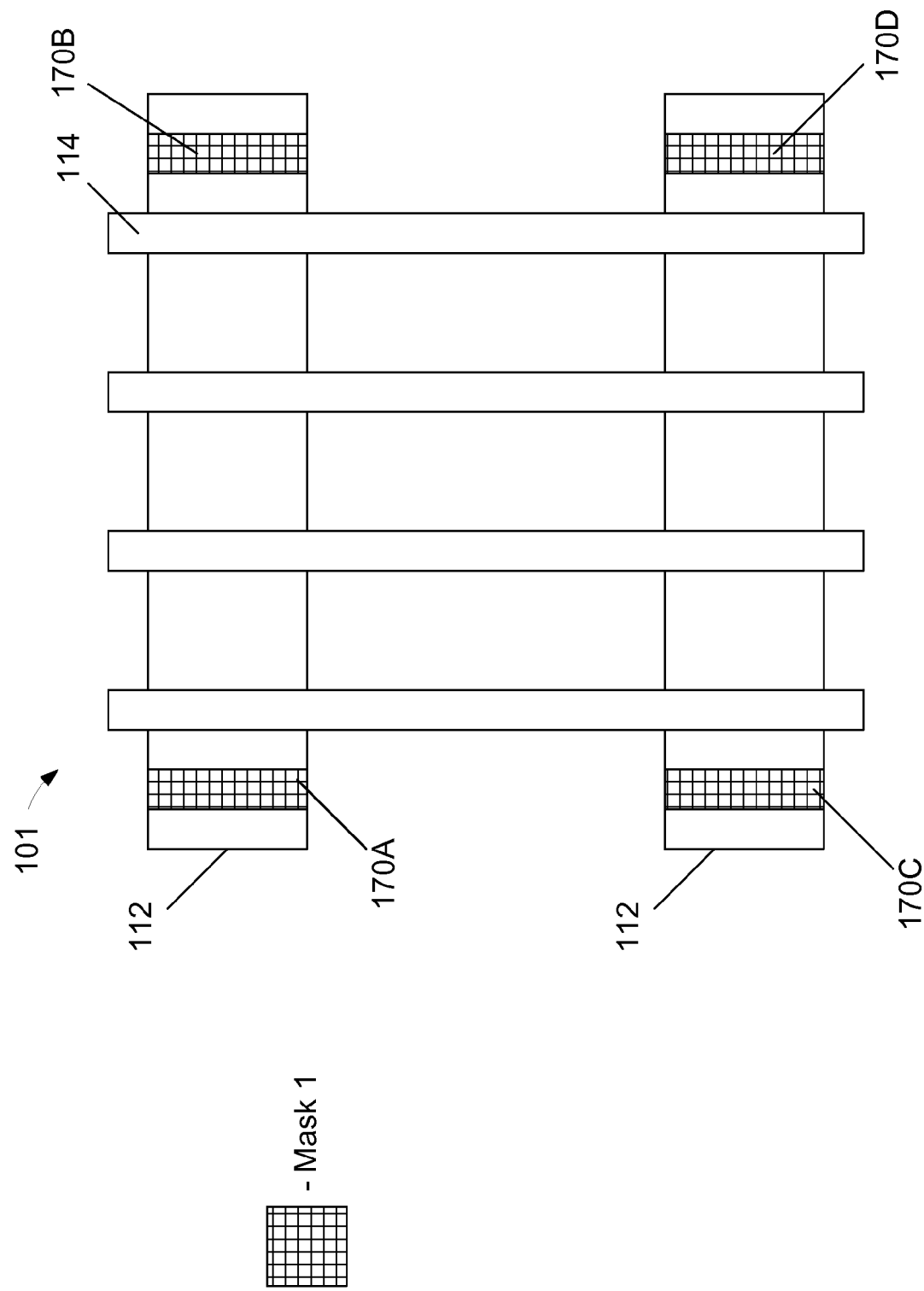

METHODS OF FORMING A CIRCUIT THAT INCLUDES A CROSS-COUPLING GATE CONTACT STRUCTURE WHEREIN THE CIRCUIT IS TO BE MANUFACTURED USING A TRIPLE PATTERNING PROCESS

BACKGROUND OF THE INVENTION

1. Field of the Invention

Generally, the present disclosure relates to the manufacture of sophisticated semiconductor devices, and, more specifically, to various methods of forming a circuit that includes a cross-coupling gate contact structure wherein the circuit is to be manufactured using a triple patterning process.

2. Description of the Related Art

Photolithography is one of the basic processes used in manufacturing integrated circuit products. At a very high level, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching or ion implantation processes, may then be performed on the underlying layer of material or substrate through the patterned mask layer.

Of course, the ultimate goal in integrated circuit fabrication is to faithfully reproduce the original circuit design on the integrated circuit product. Historically, the feature sizes and pitches (spacing between features) employed in integrated circuit products were such that a desired pattern could be formed using a single patterned photoresist masking layer. However, in recent years, device dimensions and pitches have been reduced to the point where existing photolithography tools, e.g., 193 nm wavelength photolithography tools, cannot form a single patterned mask layer with all of the features of the overall target pattern.

Accordingly, device designers have resorted to techniques that involve performing multiple exposures to define a single target pattern in a layer of material. One such technique is generally referred to as double patterning. In general, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features that would otherwise be impossible using existing photolithography tools. One well-known double patterning technique is referred to as LELE ("litho-etch-litho-etch") double patterning. As the name implies, the LELE process involves forming two photoresist etch masks and performing two etching processes to transfer the desired overall pattern to a hard mask layer that is then used as an etch mask to etch an underlying layer of material.

Double patterning techniques have been successfully employed in manufacturing integrated circuits using 20 nm and 14 nm technology. However, as device dimensions continue to shrink and packing densities continue to increase, for example, in 10 nm technology (and beyond) based integrated circuit products, double patterning techniques are insufficient to form at least some of the features in such products. Accordingly, mask designers have begun using so-called triple patterning techniques to form the circuits on such advanced integrated circuit products. As its name implies, triple patterning is an exposure method that involves separating a dense overall target circuit pattern into three separate, less-dense patterns. Each of the three simplified, less-dense patterns are then printed separately on a wafer utilizing three separate masks or reticles. One well-known triple patterning technique is referred to as LELELE ("litho-etch-litho-etch-litho-etch") triple patterning. As the name implies, the LELELE triple patterning process involves forming three photoresist etch masks and performing three etching processes to transfer the desired overall pattern to a hard mask layer that is then used as an etch mask to etch an underlying layer of material.

Cross-coupling gate contact structures are important for standard cell design to achieve product area scaling goals of advanced technology nodes. Such cross-coupling gate contact structures may be employed in a variety of common circuits, e.g., flip-flops, MUX, etc. FIG. 1A depicts a simplified example of a prior art circuit 10 employing such a cross-coupling gate contact structure 20. In general, the circuit 10 is comprised of a plurality of transistor structures that are formed in and above spaced-apart regions 12 of a semiconductor substrate that are separated by isolation material, e.g., silicon dioxide. The circuit 10 further includes a plurality of gate structures 14, source/drain regions 16, source/drain contact structures 18 and an illustrative cross-coupling gate contact structure 20. The source/drain contact structures 18 and the cross-coupling gate contact structure 20 are formed after the gate structures 14 and the source/drain regions 16 are formed. In general, the source/drain contact structures 18 and the cross-coupling gate contact structure 20 are formed at the device contact level, i.e., at a level below the so-called via zero (V0) that is formed to establish electrical contact between the device level contacts and the first general metal layer (so-called M1 layer) that is the first general wiring layer for the integrated circuit product. In the embodiment shown in FIG. 1A, the cross-coupling gate contact structure 20 is formed at an angle of about 45° relative to the long axis of the gate structures 14. FIG. 1B depicts an alternative example of a cross-coupling gate contact structure 20A that has a portion that is positioned approximately at right angles to the long axis of the two connected gate structures 14. In some integration schemes, the cross-coupling gate contact structure 20 connects the gate through another contact structure that is called a gate contact and not shown in the simplified schematic as shown in FIG. 1A. Other configurations of such cross-coupling gate contact structures are also possible.

The use of such cross-coupling gate contact structures is highly desirable because it enables a reduction in cell area and it reduces manufacturing complexities. Absent the use of such cross-coupling gate contact structures, the electrical connections to the connected gate structures would have to be made using features formed in the V0 and M1 layers, which would thereby complicate the manufacturing of those features and increase the already tight spacing that exists in the V0/M1 layers.

As noted above, the integrated circuit design is eventually fabricated by transferring the circuit layout to a semiconductor substrate in a series of layers that collectively will form the features that constitute the devices that make up the components of the integrated circuit. However, before the layout can be fabricated, a validation process of the layout must take place. Layout designers use very sophisticated Electronic Design Automation (EDA) tools and programs when designing circuit layouts for modern integrated circuit products. As it relates to triple patterning techniques, an overall target pattern must be what is referred to as triple-patterning-compliant. In general, this means that an overall target pattern is capable of being decomposed into three separate patterns that each may be printed in a single layer using existing photolithography tools. Layout designers sometimes speak of such patterns with reference to "colors," wherein the first mask will be represented in the EDA tool using a first color, the second mask will be represented in the EDA tool using a second, different color, and the third mask will be represented in the EDA tool using a third color that is different from the colors used to represent the first and second masks. To the extent a layout is non-triple-patterning-compliant, it is sometimes stated to present a "coloring conflict" between the conflicting masks.

Unfortunately, in 10 nm technology and below, cross-coupling gate contact structures, such as those depicted in FIG. 1A, that are assigned to a single mask cannot be made using traditional triple patterning techniques because of coloring conflict rules. FIG. 1C depicts one illustrative example of possible color assignment of the source/drain contact structures 18 (18A-J) and the cross-coupling gate contact structure 20 to masks 1-3 in an attempt to form the circuit 10 using triple patterning techniques. As depicted therein, the source/drain contact structures 18A, 18C, 18E, 18F, 18H and 18J and the cross-coupling gate contact structure 20 are assigned to Mask 1. The source/drain contact structures 18G and 18I are assigned to Mask 2. The source/drain contact structures 18B and 18D are assigned to Mask 3. The coloring assignment depicted in FIG. 1C cannot be formed using triple patterning techniques because the spacing 17 between the cross-coupling gate contact structure 20 and the nearest source/drain contact structures, e.g., the features 18C and 18H, all three of which are formed on Mask 1, violate the minimum spacing rules for Mask 1. If such cross-coupling gate contact structures cannot be used in future integrated circuit products that are required to be formed using triple-patterning techniques, then there will be an undesirable increase in the plot space consumed by such circuits and manufacturing such circuits will become more complex.

The present disclosure is directed to various methods of forming a circuit that includes a cross-coupling gate contact structure wherein the circuit is to be manufactured using a triple patterning process which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a circuit that includes a cross-coupling gate contact structure wherein the circuit is to be manufactured using a triple patterning process. One illustrative method disclosed herein includes, among other things, forming a hard mask layer above a layer of insulating material, patterning the hard mask layer using three patterned photoresist etch masks, wherein a first feature corresponding to a portion, but not all, of the cross-coupling gate contact structure is present in a first of the three patterned photoresist etch masks and a second feature corresponding to a portion, but not all, of the cross-coupling gate contact structure is present in a second or a third of the three patterned photoresist etch masks, after patterning the hard mask layer using the three patterned photoresist etch masks, patterning the layer of insulating material using the patterned hard mask layer as an etch mask so as to thereby form a trench in the layer of insulating material for the cross-coupling gate contact structure, and forming the cross-coupling gate contact structure in the trench.

Another illustrative method disclosed herein includes, among other things, forming a hard mask layer above a layer of insulating material, patterning the hard mask layer using three patterned photoresist etch masks, wherein a first feature corresponding to a portion, but not all, of the cross-coupling gate contact structure is present in a first of the three patterned photoresist etch masks, a second feature corresponding to a portion, but not all, of the cross-coupling gate contact structure is present in a second of the three patterned photoresist etch masks and a third feature corresponding to a portion, but not all, of the cross-coupling gate contact structure is present in a third of the three patterned photoresist etch masks, after patterning the hard mask layer using the three patterned photoresist etch masks, patterning the layer of insulating material using the patterned hard mask layer as an etch mask so as to thereby form a trench in the layer of insulating material for the cross-coupling gate contact structure, and forming the cross-coupling gate contact structure in the trench.

Yet another illustrative method disclosed herein includes, among other things, forming a hard mask layer above a layer of insulating material, patterning the hard mask layer using three patterned photoresist etch masks, wherein a first feature corresponding to a portion, but not all, of a pass-through contact structure is present in a first of the three patterned photoresist etch masks and a second feature corresponding to a portion, but not all, of the pass-through contact structure is present in a second of the three patterned photoresist etch masks, after patterning the hard mask layer using the three patterned photoresist etch masks, patterning the layer of insulating material using the patterned hard mask layer as an etch mask so as to thereby form a trench in the layer of insulating material for said pass-through contact structure, wherein the trench extends across at least two spaced-apart, isolated semiconductor regions, and forming the pass-through contact structure in the trench.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict various illustrative prior art circuit layouts that include cross-coupling gate contact structures;

FIGS. 3A-3D depict another illustrative method disclosed herein for forming a circuit that includes a cross-coupling gate contact structure wherein the circuit is manufactured using a triple patterning process;

FIGS. 5A-5E depict one illustrative method disclosed herein for forming a circuit that includes a pass-through contact structure wherein the circuit is manufactured using a triple patterning process.

Figure 1C:
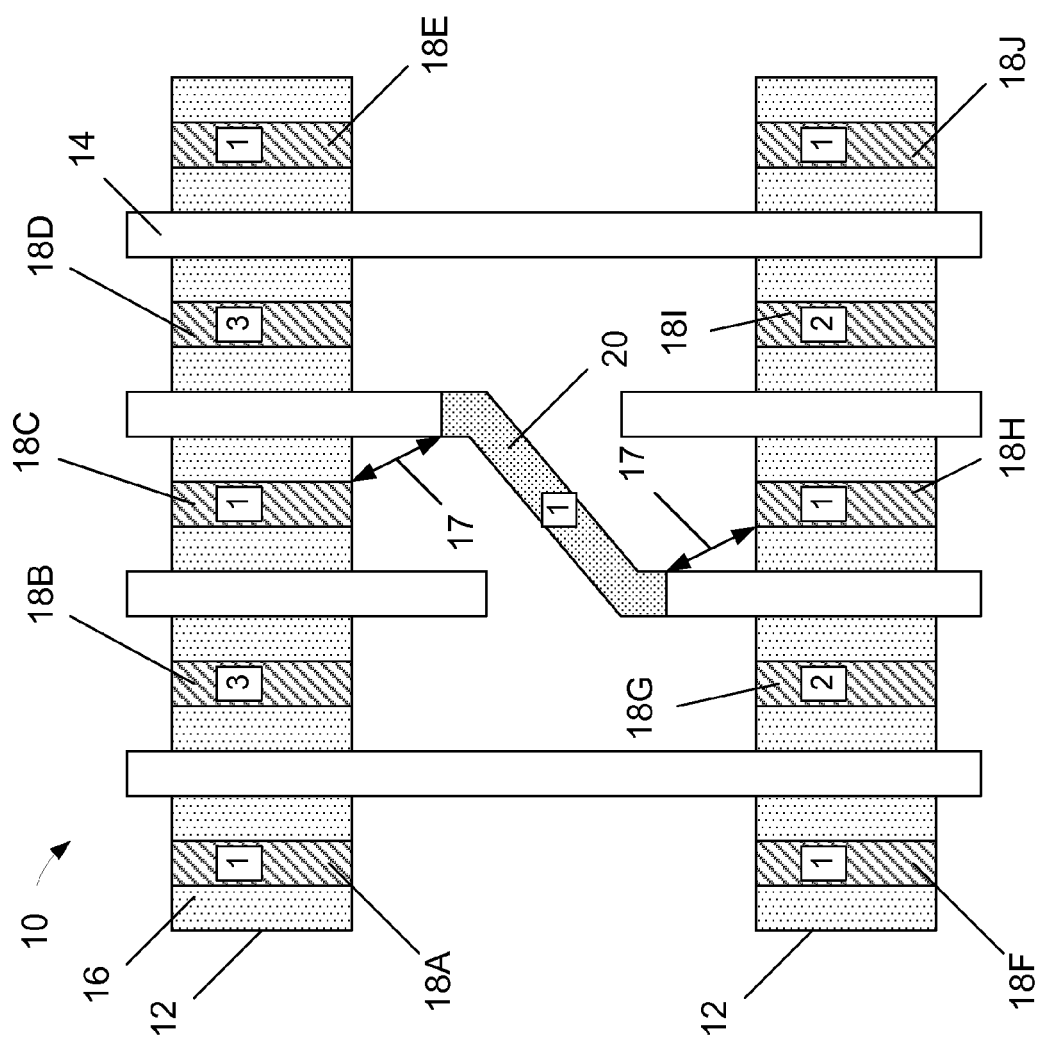

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a circuit that includes a cross-coupling gate contact structure wherein the circuit is to be manufactured using a triple patterning process. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods and devices disclosed herein will now be described in more detail.

Figure 2A:
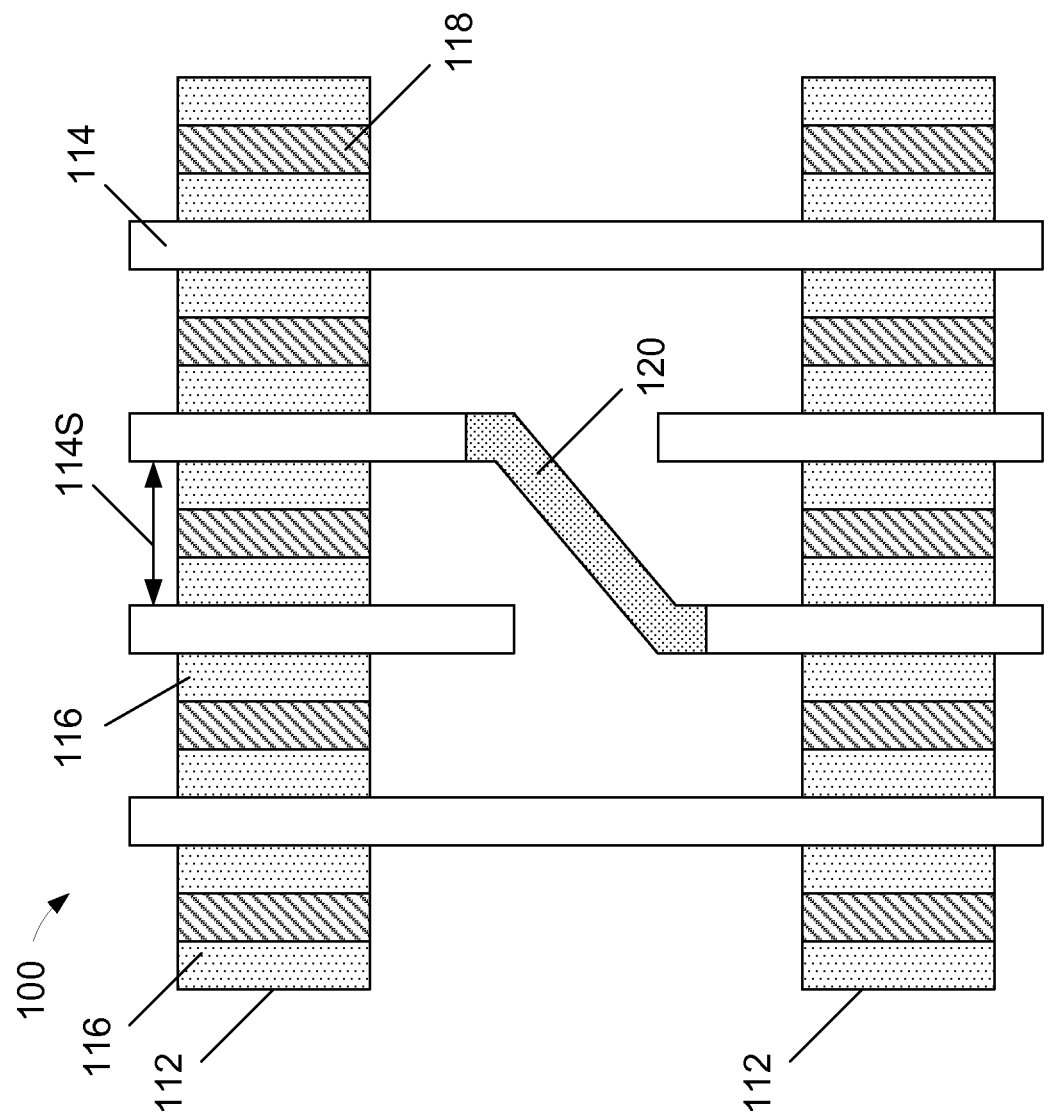
FIGS. 2A-2E depict one illustrative method disclosed herein for forming a circuit that includes a cross-coupling gate contact structure wherein the circuit is manufactured using a triple patterning process.

Certain aspects of the present subject matter will now be described with reference to FIGS. 2A-2E. FIG. 2A depicts a simplified example of an illustrative circuit 100 that includes an illustrative example of a cross-coupling gate contact structure 120 that may be formed using triple patterning techniques. In general, the circuit 100 is comprised of a plurality of transistor structures that are formed in and above spaced-apart regions 112 of a semiconductor substrate that are separated by isolation material, e.g., silicon dioxide. The circuit 100 further includes a plurality of gate structures 114, a plurality of source/drain regions 116, a plurality of source/drain contact structures 118 and the illustrative cross-coupling gate contact structure 120. The source/drain contact structures 118 and the cross-coupling gate contact structure 120 are formed after the gate structures 114 and the source/drain regions 116 are formed. In general, the source/drain contact structures 118 and the cross-coupling gate contact structure 120 are formed at the device contact level, i.e., at a level below the so-called via zero (V0) that is formed to establish electrical contact between the device level contacts and the first general metal layer (so-called M1 layer) that is the first general wiring layer for the integrated circuit product. In the embodiment shown in FIG. 2A, the cross-coupling gate contact structure 120 is formed at an angle of about 45° relative to the long axis of the gate structures 114. Other configurations of such cross-coupling gate contact structures are also possible and they may be fabricated using the triple patterning techniques disclosed herein. In one embodiment, the spacing 114S between the gate structures 114 that are coupled together using the cross-coupling gate contact structure 120 may be about 50 nm or less.

Additionally, various doped regions, e.g., halo implant regions, well regions and the like, and other structures, e.g., sidewall spacers, are not depicted in the attached drawings so as to facilitate explanation of the presently disclosed inventions. The substrate may have a variety of configurations, such as the depicted bulk silicon configuration. The substrate may also have a silicon-on-insulator (SOI) configuration that includes a bulk silicon layer, a buried insulation layer and an active layer, wherein semiconductor devices are formed in and above the active layer. The substrate may be made of silicon or it may be made of materials other than silicon. Thus, the terms "substrate" or "semiconductor substrate" should be understood to cover all semiconducting materials and all forms of such materials. The various components and structures of the circuit 100 may be formed using a variety of different materials and by performing a variety of known techniques, e.g., deposition, etching, ion implantation, etc. Thus, the presently disclosed inventions should not be considered to be limited to any particular manufacturing method for forming the features of the circuit 100 using the triple patterning method disclosed herein.

In general, the methods disclosed herein may be used to form a circuit 100 that includes a cross-coupling gate contact structure wherein the circuit 100 is to be manufactured using a triple patterning process. That is, using the methods disclosed herein, a hard mask layer that is to be patterned so as to form a patterned etch mask is formed above an underlying layer of insulating material where the conductive contact structures will ultimately be formed. Thereafter, a patterned photoresist etch mask corresponding to one of the masks used in the triple patterning process (Masks 1-3), e.g., Mask 1, is formed above the hard mask layer. An etching process is then performed on the hard mask layer through the patterned photoresist etch mask corresponding to Mask 1 to transfer the features in Mask 1 to the hard mask layer, i.e., to form openings in the patterned hard mask layer that correspond to the features in Mask 1. The patterned photoresist etch mask corresponding to Mask 1 is then removed. The process is then repeated for Mask 2 and Mask 3. Of course, the hard mask layer may be patterned using any desired order of the Masks 1-3. After the various etching processes are formed using Masks 1-3, the now-patterned hard mask layer is then used as an etch mask to pattern the underlying layer of insulating material, i.e., to form trenches or openings in the underlying layer of insulating material. The patterned hard mask layer may or may not be removed after the underlying layer of insulating material is patterned. Thereafter, the source/drain contact structures 118 and the cross-coupling gate contact structure 120 may be formed in the patterned layer of insulating material using traditional techniques. The manner in which the contacts are formed in the patterned layer of insulating material are well known to those skilled in the art. Thus, the manner in which the source/drain contact structures 118 and the cross-coupling gate contact structure 120 are formed once the underlying layer of insulating material is patterned should not be considered to be a limitation of the present invention. Moreover, the source/drain contact structures 118 and the cross-coupling gate contact structure 120 may be made of any desired conductive material, e.g., tungsten, copper, etc. Using this technique, the contact features for the circuit 100, including the cross-coupling gate contact structure 120, may be formed using triple patterning techniques.

Figure 2B:
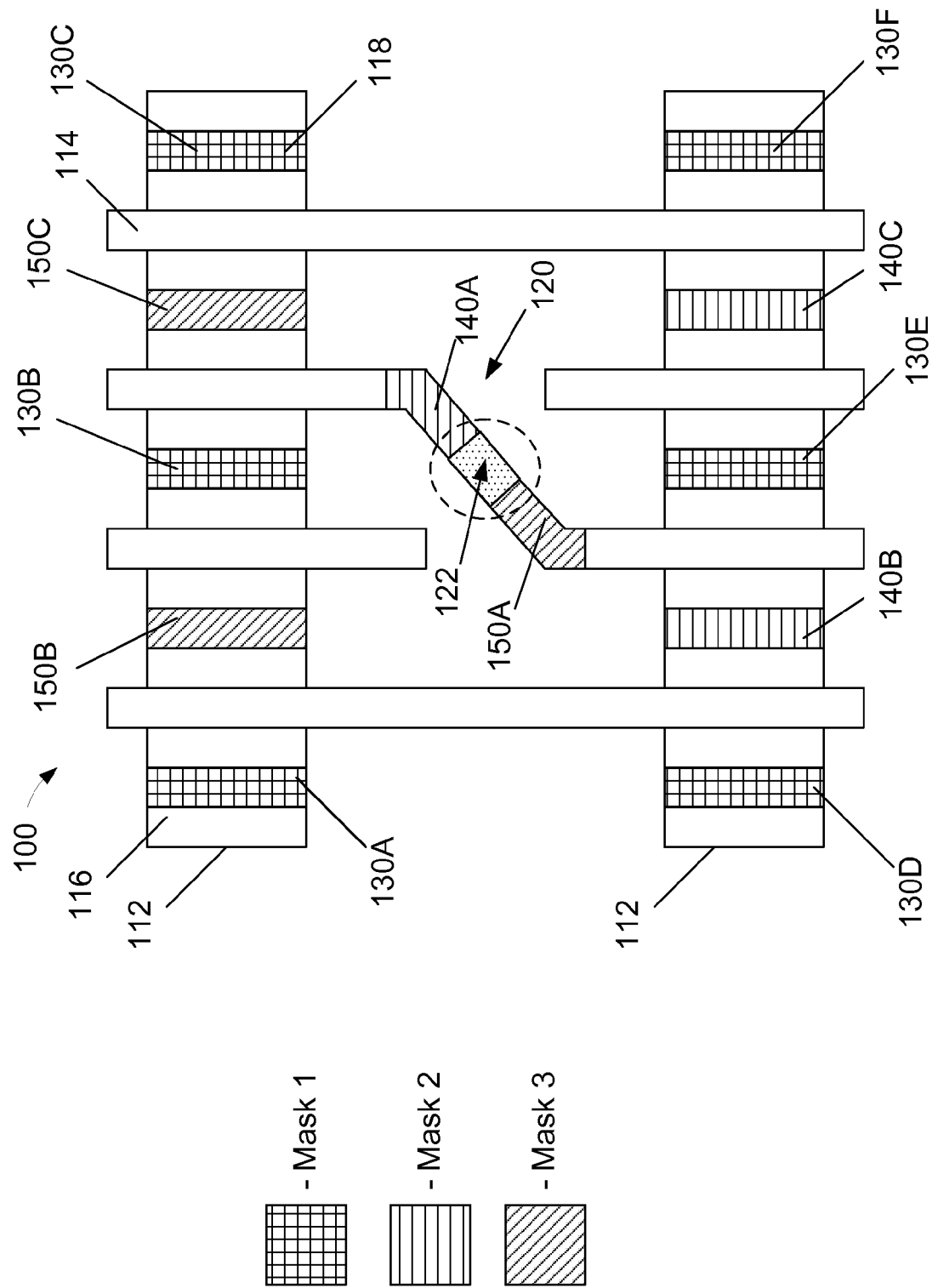
Figure 2C:
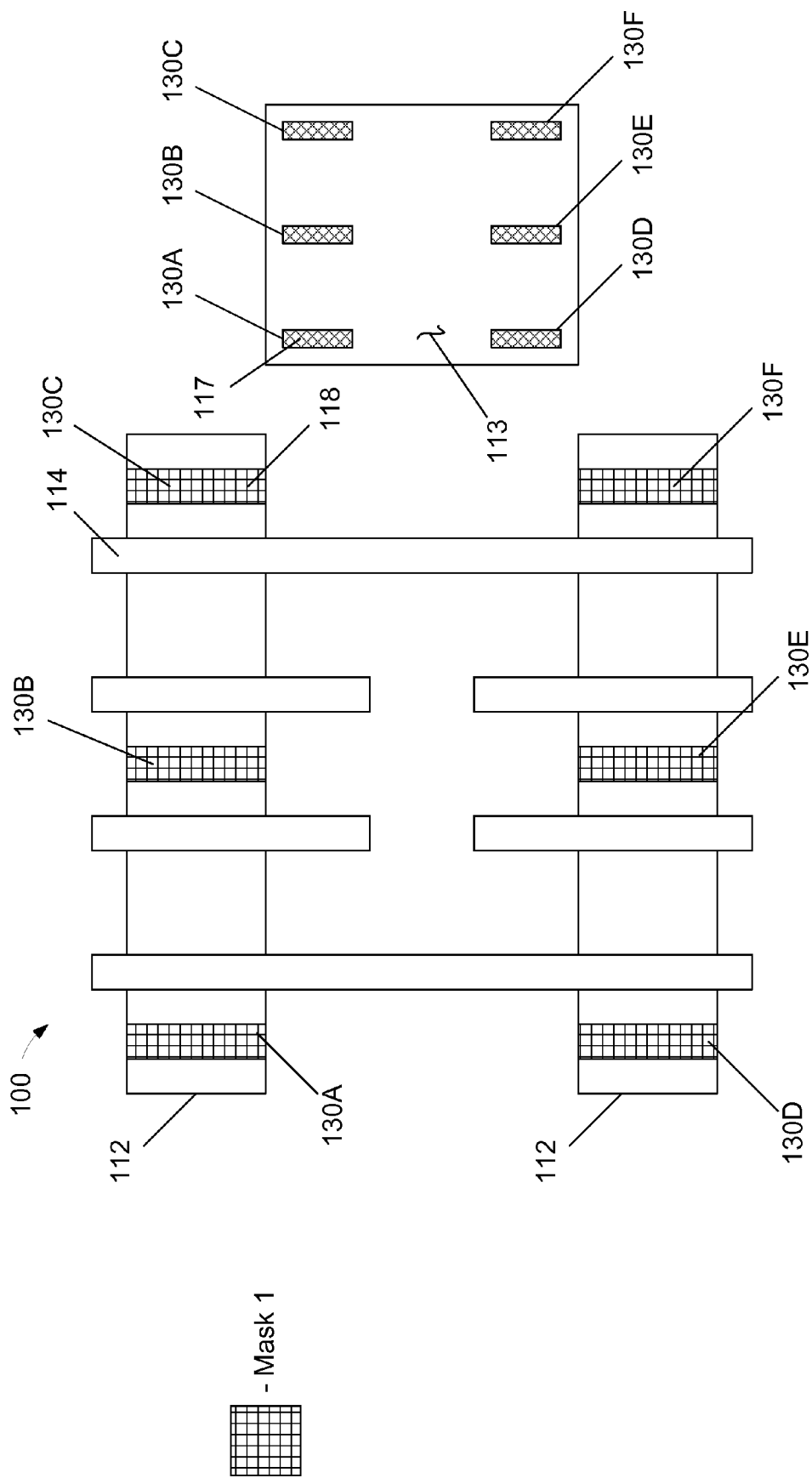
Figure 2D:
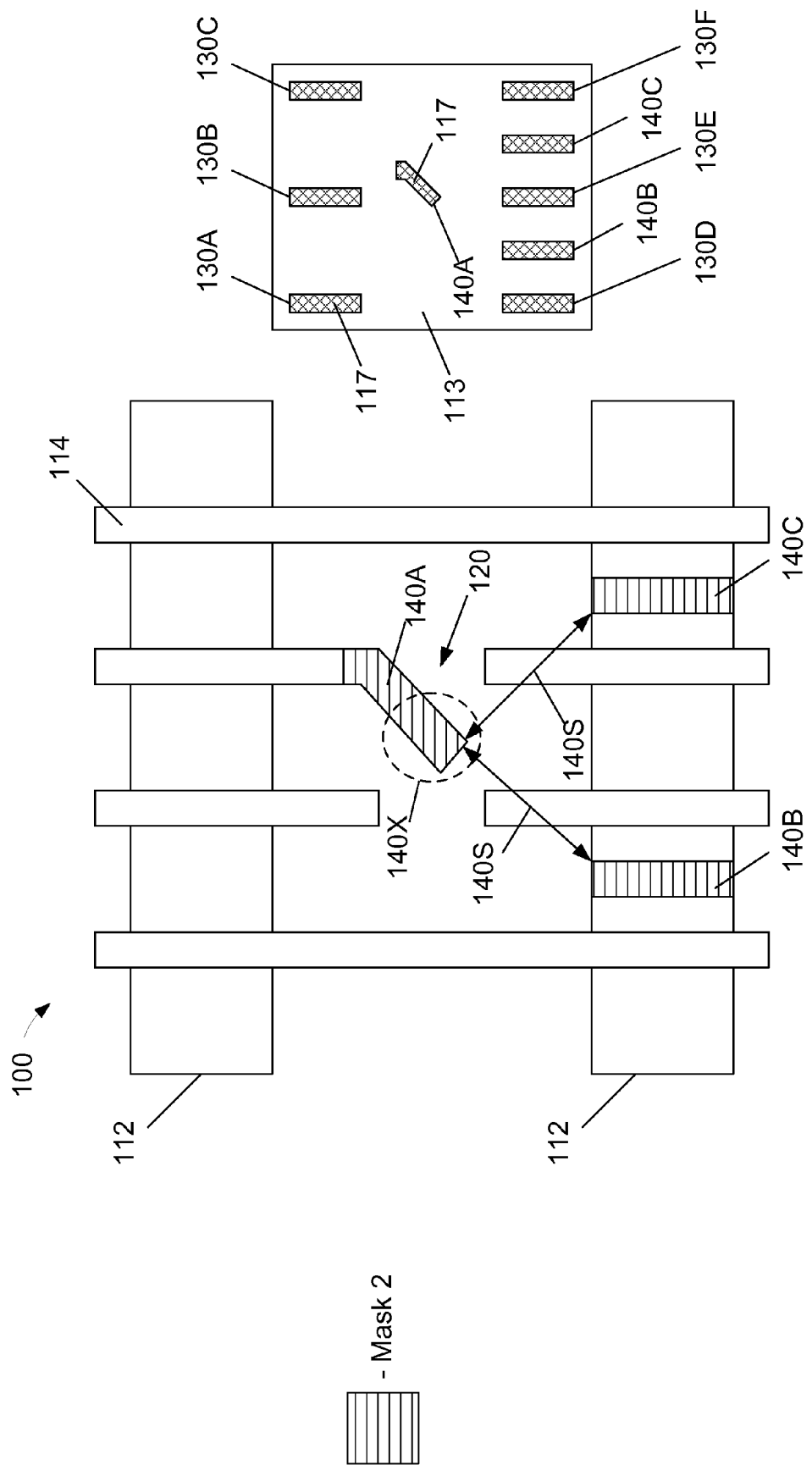
Figure 2E:
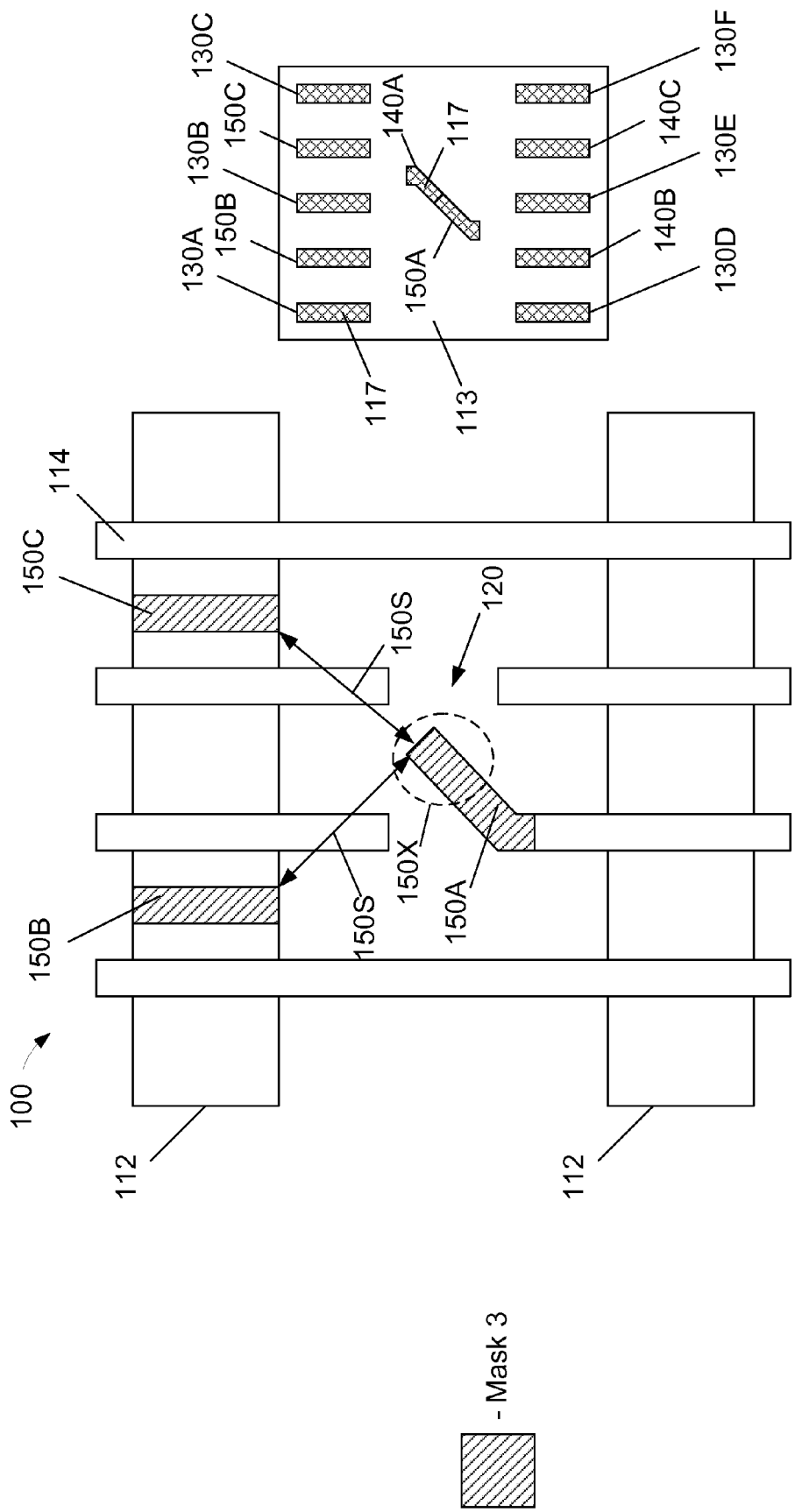

As noted above, fabricating the source/drain contact structures 118 and the cross-coupling gate contact structure 120 of the circuit 100 using a triple patterning process involves forming three photoresist etch masks and performing three etching processes to transfer the desired overall pattern of the source/drain contact structures 118 and the cross-coupling gate contact structure 120 to a hard mask layer that is then used as an etch mask to etch the desired features into an underlying layer of insulating material. In FIGS. 2B-2E, the three masks (1-3) are depicted with different shading to facilitate explanation. FIG. 2B depicts the features, i.e., openings that will be formed in the hard mask layer using all three masks, while FIGS. 2C, 2D and 2E are views of each of the features that will be formed in the hard mask layer using each of the individual masks 1-3, respectively.

With reference to FIG. 2B, in one illustrative embodiment, the first mask ("Mask 1") may be used to form a plurality of features 130A-F (a subset of the source/drain contact structures 118 for the overall circuit 100). In one illustrative embodiment, the second mask ("Mask 2") may be used to form a plurality of features 140A-C, wherein the features 140B-C are a subset of the source/drain contact structures 118 for the overall circuit 100, and the feature 140A corresponds to a portion of the cross-coupling gate contact structure 120. Importantly, the feature 140A corresponds to a portion, but not all, of the overall cross-coupling gate contact structure 120. In one illustrative embodiment, the third mask ("Mask 3") may be used to form a plurality of features 150A-C, wherein the features 150B-C are a subset of the source/drain contact structures 118 for the overall circuit 100, and the feature 150A corresponds to a portion, but not all, of the cross-coupling gate contact structure 120. As depicted in FIG. 2B, the features 140A and 150A are sized and configured such that, when the openings are formed in the patterned hard mask layer corresponding to these two features, they overlap one another, in the area indicated by the region 122. Due to this overlapping relationship, a continuous cross-coupling gate contact structure 120 may ultimately be formed in the patterned layer of insulating material so as to provide electrical connection between the two cross-coupled gate structures 114. In the embodiment shown in FIGS. 2A-2E, the formation of the cross-coupling gate contact structure 120 is accomplished by forming features corresponding to separate portions of the cross-coupling gate contact structure 120 using two different masks. Of course, if desired, using the methods disclosed herein, the cross-coupling gate contact structure 120 could be manufactured by forming features corresponding to portions of the cross-coupling gate contact structure 120 using each of the three masks used during the triple patterning process, as described more fully below. By forming the overall cross-coupling gate contact structure 120 using features that are formed using at least two of the three masks used in the triple patterning process, the highly desirable cross-coupling gate contact structure 120 can be manufactured using triple patterning techniques.

FIG. 2C is a view depicting the features that may be formed using one illustrative example of Mask 1. As shown therein, the Mask 1 features 130A-F are a subset of the source/drain contact structures 118 for the overall circuit 100. The spacing between the adjacent features shown in Mask 1 does not violate the minimum spacing rules for Mask 1.

FIG. 2D is a view depicting the features that may be formed using one illustrative example of Mask 2. As shown therein, the Mask 2 features 140B-C are a subset of the source/drain contact structures 118 for the overall circuit 100. As noted above, the Mask 2 feature 140A represents an opening that will be formed in the patterned hard mask layer. Importantly, the feature 140A corresponds to a portion, but not all, of the overall cross-coupling gate contact structure 120. The feature 140A is sized such that it has an overlap portion 140X that will overlap the opening formed in the hard mask layer using the feature 150A defined in Mask 3. As long as the spacing 140S between the feature 140A and the nearest other feature formed using Mask 2, e.g., the feature 140B, does not violate the minimum spacing rules for Mask 2, then the feature 140A may be formed using Mask 2.

FIG. 2E is a view depicting the features that will be formed using one illustrative example of Mask 3. As shown therein, the Mask 3 features 150B-C are a subset of the source/drain contact structures 118 for the overall circuit 100. As noted above, the Mask 3 feature 150A represents an opening that will be formed in the patterned hard mask layer. Importantly, the feature 150A corresponds to a portion, but not all, of the overall cross-coupling gate contact structure 120. The feature 150A is sized such that it has an overlap portion 150X that will overlap the opening formed in the patterned hard mask using the feature 140A defined in Mask 2. As long as the spacing 150S between the feature 150A and the nearest other feature formed using Mask 3, e.g., the feature 150C, does not violate the minimum spacing rules for Mask 3, then the feature 150A may be formed using Mask 3.

FIGS. 2C-2E also contain a plan view of an illustrative hard mask layer 113 that is formed above an illustrative layer of insulating material 117. FIGS. 2C-2E depict the patterning of the hard mask layer 113 using the illustrative processing sequence where the hard mask layer is patterned using patterned photoresist masks corresponding to Masks 1-3 (in that order). Thus, FIG. 2C depicts the hard mask layer 113 after it has been patterned using a patterned photoresist that was formed using Mask 1 (with features 130A-F). This patterning exposes portions of the underlying layer of insulating material 117. The patterned photoresist mask corresponding to Mask 1 was then removed. FIG. 2D depicts the hard mask layer 113 after it has been patterned using a patterned photoresist that was formed using Mask 2 (with features 140A-C). This patterning exposes additional portions of the underlying layer of insulating material 117. The patterned photoresist mask corresponding to Mask 2 was then removed. FIG. 2E depicts the hard mask layer 113 after it has been patterned using a patterned photoresist that was formed using Mask 3 (with features 150A-C). This patterning exposes yet additional portions of the underlying layer of insulating material 117. The patterned photoresist mask corresponding to Mask 3 was then removed. Due to the overlap between the features 140A and 150A, the trench or opening that is ultimately formed in the underlying layer of insulating material 117 is continuous in nature and may be filled with a conductive material so as to form the illustrative cross-coupling gate contact structure 120 that conductively couples the cross-coupled gate structures 114 to one another.

Figure 3A:
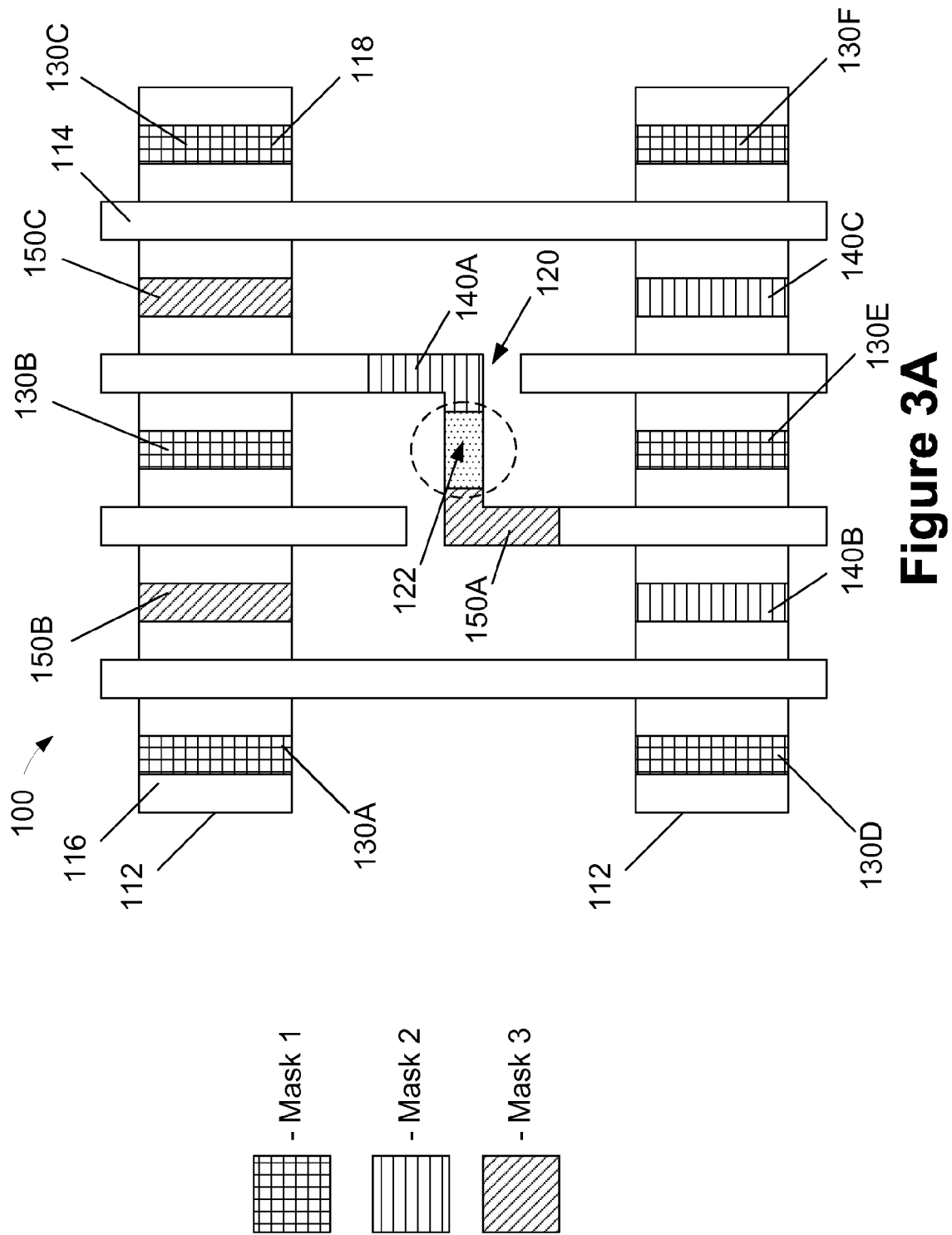
Figure 3B:
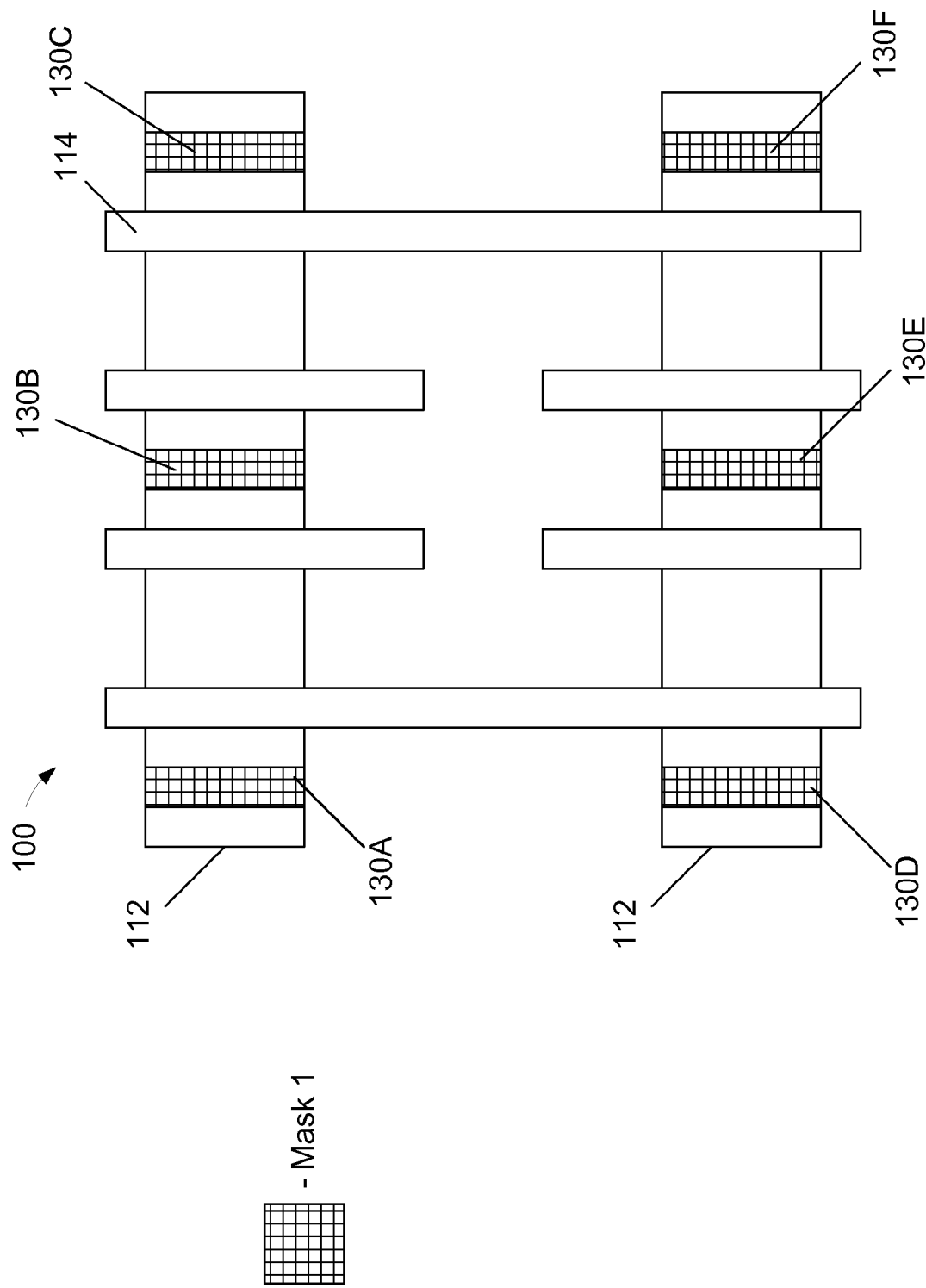
Figure 3C:
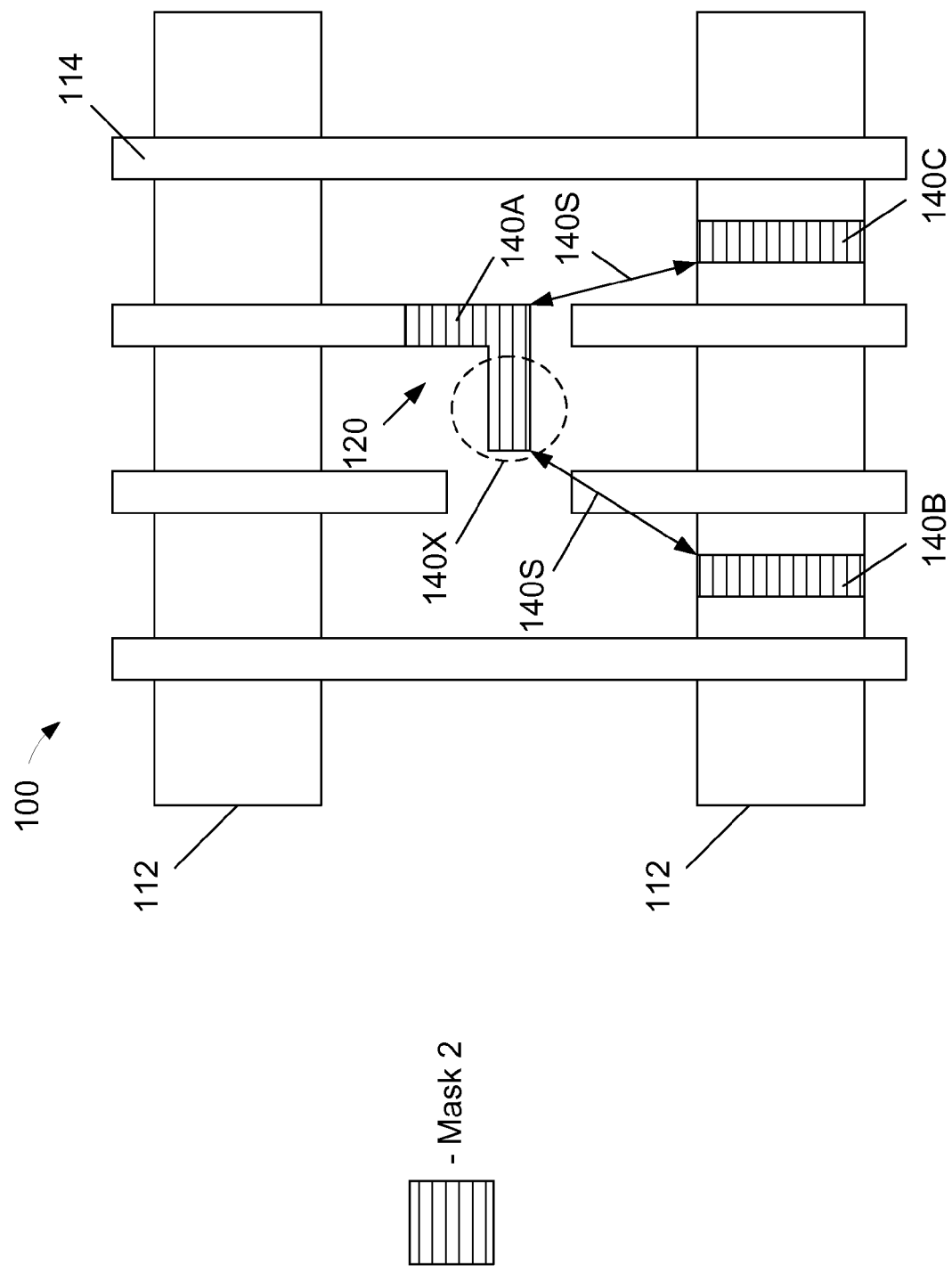

FIGS. 3A-3D depict another illustrative example of a circuit 100 that includes a version of a cross-coupling gate contact structure 120 that may be formed using triple patterning techniques by using the methods described herein. More specifically, in the example shown in FIGS. 3A-3D, the cross-coupling gate contact structure 120 has a crossover portion that is oriented at approximately 90° relative to the long axis of the gate structures 114. In FIGS. 3A-3D, the three masks (1-3) are depicted with different shading to facilitate explanation. FIG. 3A depicts the features, i.e., openings that will be formed in the hard mask layer using all three masks, while FIGS. 3B, 3C and 3D are views of each of the features that will be formed in the hard mask layer using each of the individual masks 1-3, respectively.

With reference to FIG. 3A, in one illustrative embodiment, the first mask ("Mask 1") may be used to form a plurality of features 130A-F (a subset of the source/drain contact structures 118 for the overall circuit 100). In one illustrative embodiment, the second mask ("Mask 2") may be used to form a plurality of features 140A-C, wherein the features 140B-C are a subset of the source/drain contact structures 118 for the overall circuit 100, and the feature 140A corresponds to a portion, but not all, of the cross-coupling gate contact structure 120. In one illustrative embodiment, the third mask ("Mask 3") may be used to form a plurality of features 150A-C, wherein the features 150B-C are a subset of the source/drain contact structures 118 for the overall circuit 100, and the feature 150A corresponds to a portion, but not all, of the cross-coupling gate contact structure 120. As depicted in FIG. 3A, the features 140A and 150A are sized and configured such that, when the openings are formed in the patterned hard mask layer corresponding to these two features, they overlap one another, in the area indicated by the region 122. Due to the overlap between the features 140A and 150A, the trench or opening that is ultimately formed in the underlying layer of insulating material is continuous in nature and may be filled with a conductive material so as to form the illustrative cross-coupling gate contact structure 120 that conductively couples the cross-coupled gate structures 114 to one another. In the embodiment shown in FIGS. 3A-3D, the formation of the cross-coupling gate contact structure 120 is accomplished by forming features corresponding to separate portions of the cross-coupling gate contact structure 120 using two different masks. As before, by forming the overall cross-coupling gate contact structure 120 using features that are formed using at least two of the three masks used in the triple patterning process, the highly desirable cross-coupling gate contact structure 120 can be manufactured using triple patterning techniques.

FIG. 3B is a view depicting the features that may be formed using one illustrative example of Mask 1. As shown therein, the Mask 1 features 130A-F are a subset of the source/drain contact structures 118 for the overall circuit 100. The spacing between the adjacent features shown in Mask 1 does not violate the minimum spacing rules for Mask 1.

FIG. 3C is a view depicting the features that may be formed using one illustrative example of Mask 2. As shown therein, the Mask 2 features 140B-C are a subset of the source/drain contact structures 118 for the overall circuit 100. As noted above, the Mask 2 feature 140A represents an opening that will be formed in the patterned hard mask layer. Importantly, the feature 140A corresponds to a portion, but not all, of the overall cross-coupling gate contact structure 120. The feature 140A is sized such that it has an overlap portion 140X that will overlap the opening formed in the hard mask layer using the feature 150A defined in Mask 3. As long as the spacing 140S between the feature 140A and the nearest other feature formed using Mask 2, e.g., the feature 140C, does not violate the minimum spacing rules for Mask 2, then the feature 140A may be formed using Mask 2.

FIG. 3D is a view depicting the features that will be formed using one illustrative example of Mask 3. As shown therein, the Mask 3 features 150B-C are a subset of the source/drain contact structures 118 for the overall circuit 100. As noted above, the Mask 3 feature 150A represents an opening that will be formed in the patterned hard mask layer. Importantly, the feature 150A corresponds to a portion, but not all, of the overall cross-coupling gate contact structure 120. The feature 150A is sized such that it has an overlap portion 150X that will overlap the opening formed in the hard mask layer using the feature 140A defined in Mask 2. As long as the spacing 150S between the feature 150A and the nearest other feature formed using Mask 3, e.g., the feature 150B, does not violate the minimum spacing rules for Mask 3, then the feature 150A may be formed using Mask 3.

Figure 4A:
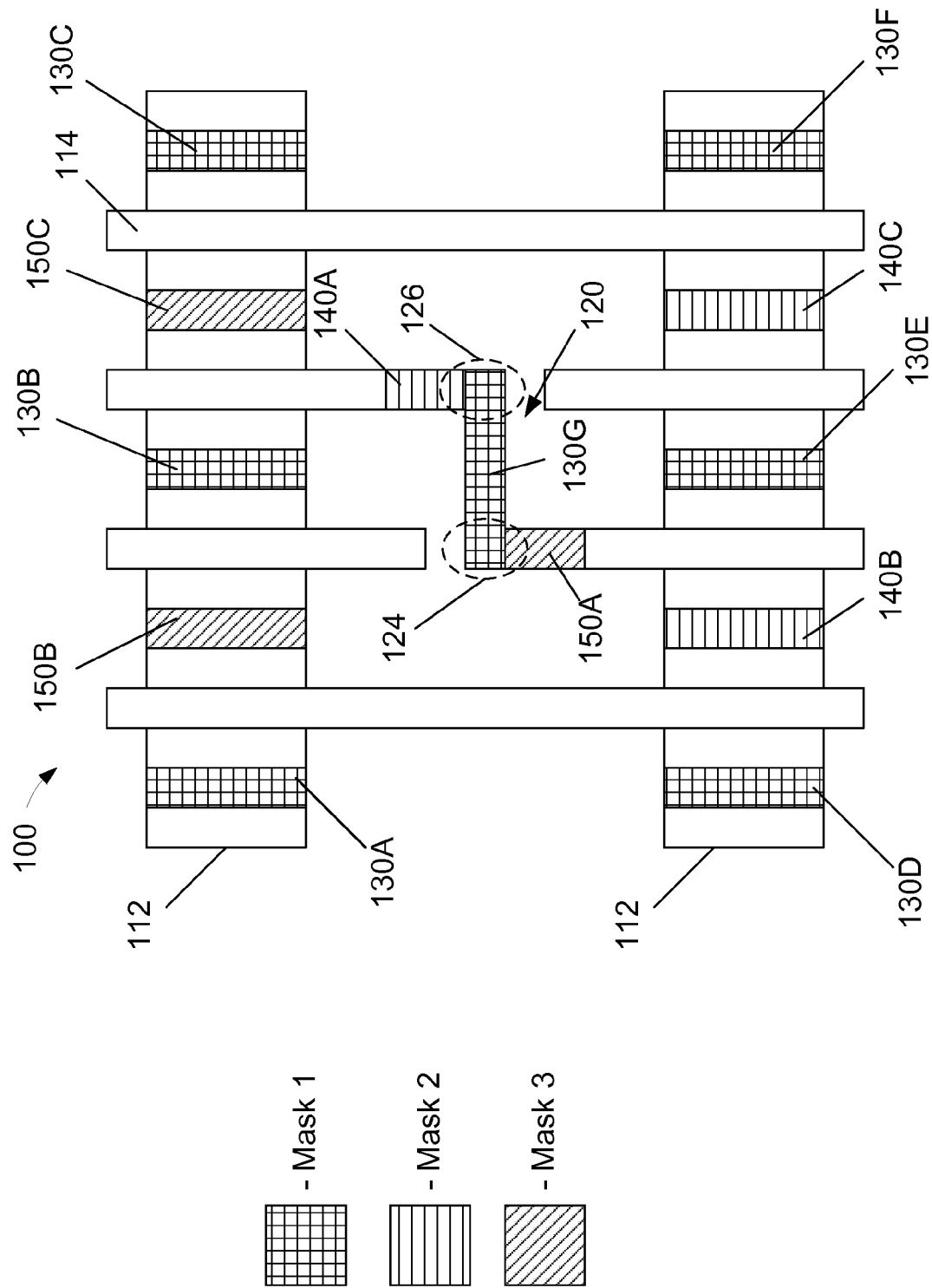
FIGS. 4A-4D depict yet another illustrative method disclosed herein for forming a circuit that includes a cross-coupling gate contact structure wherein the circuit is manufactured using a triple patterning process.
Figure 4B:
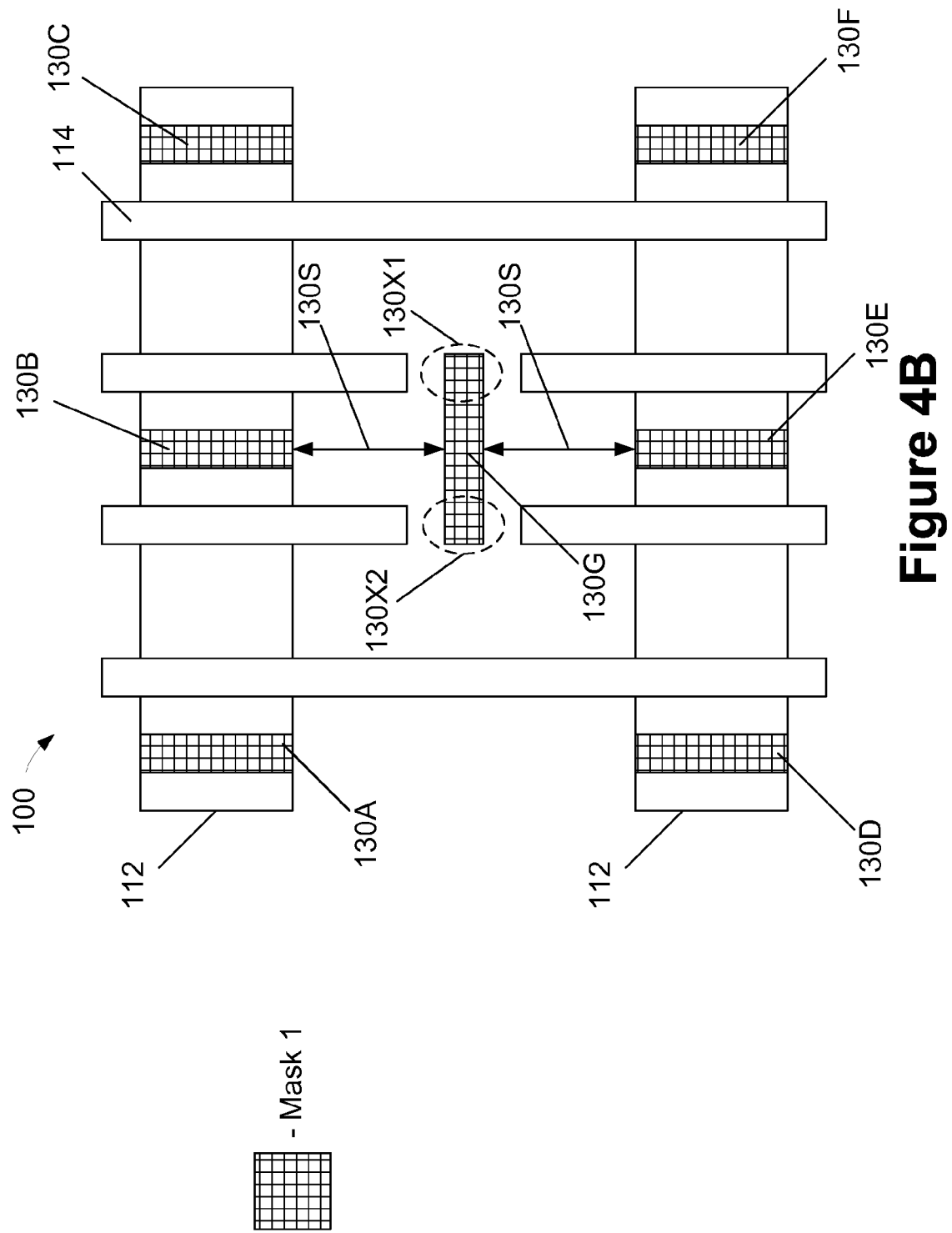
Figure 4C:
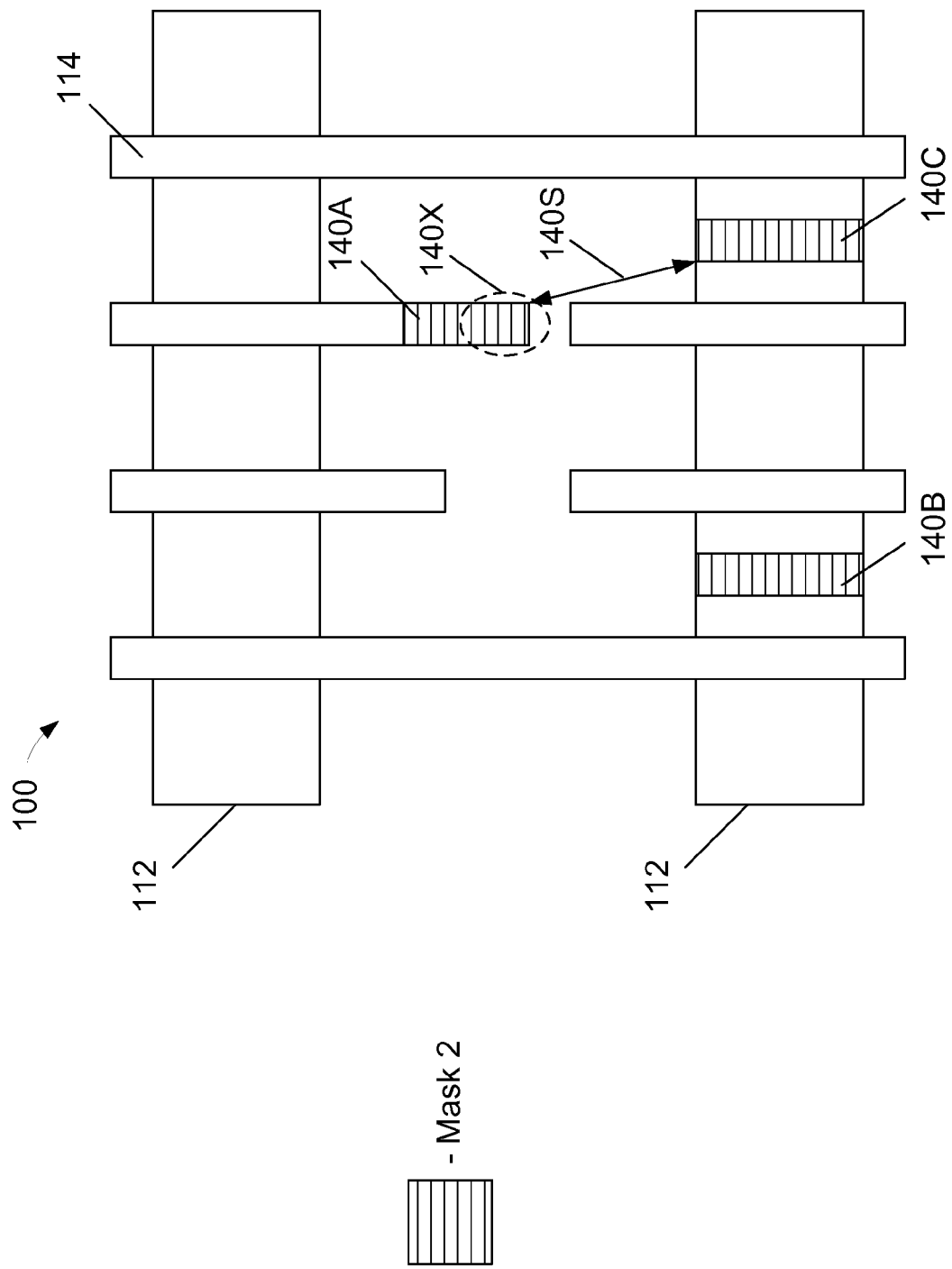
Figure 4D:
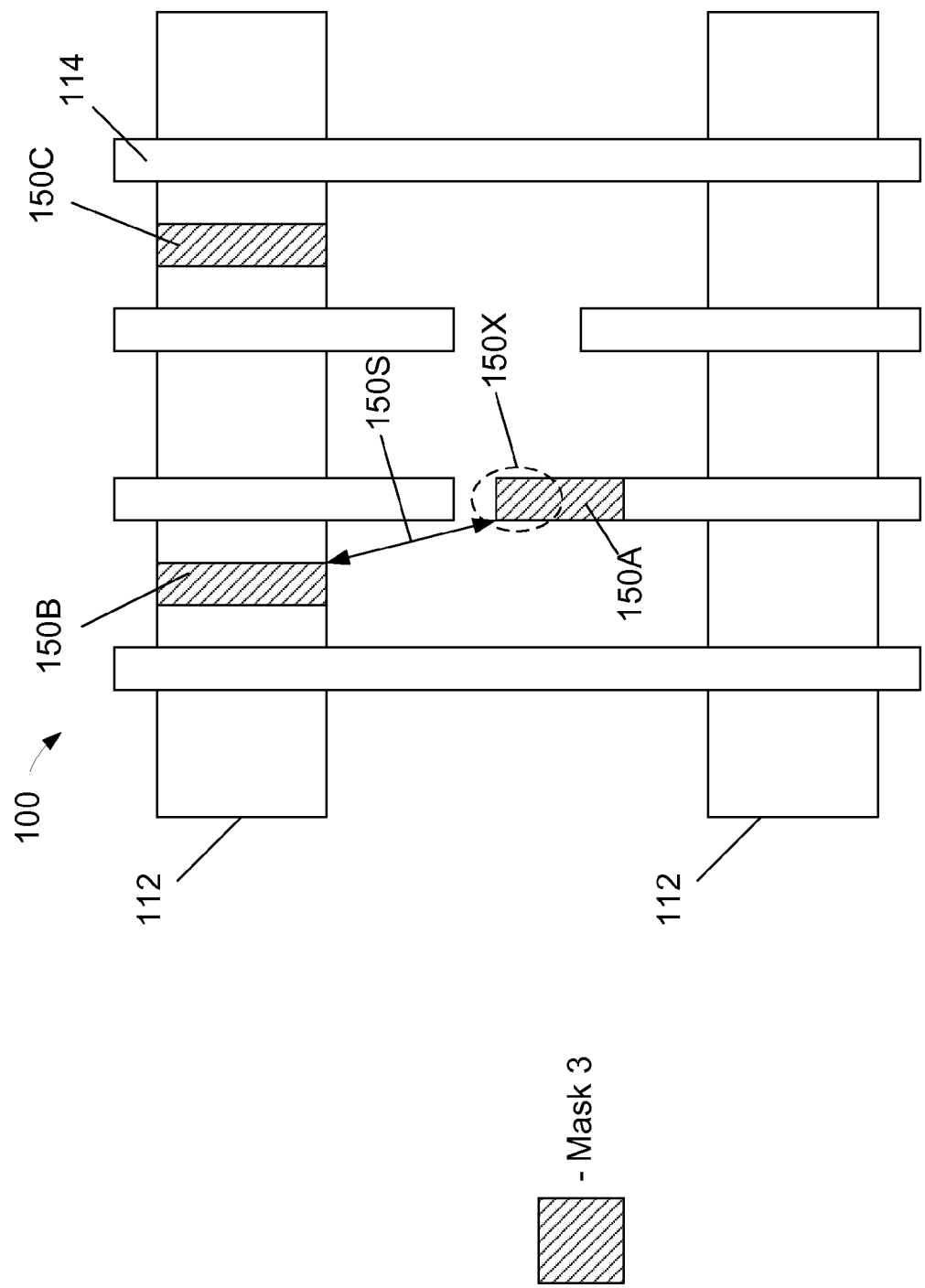

FIGS. 4A-4D depict another illustrative example of a circuit 100 that includes a cross-coupling gate contact structure 120 that may be formed using triple patterning techniques by using the methods described herein. Unlike the previous examples, in the example shown in FIGS. 4A-4D, the formation of the cross-coupling gate contact structure 120 is accomplished by forming features corresponding to separate portions of the cross-coupling gate contact structure 120 using three different masks. In FIGS. 4A-4D, the three masks (1-3) are depicted with different shading to facilitate explanation. FIG. 4A depicts the features, i.e., openings that will be formed in the hard mask layer using all three masks, while FIGS. 4B, 4C and 4D are views of each of the features that will be formed in the hard mask layer using each of the individual masks 1-3, respectively. As before, by forming the overall cross-coupling gate contact structure 120 using features that are formed using the three masks used in the triple patterning process, the highly desirable cross-coupling gate contact structure 120 can be manufactured using triple patterning techniques With reference to FIG. 4A, in one illustrative embodiment, the first mask ("Mask 1") may be used to form a plurality of features 130A-F (a subset of the source/drain contact structures 118 for the overall circuit 100) and a feature 130G that corresponds to a portion, but not all, of the cross-coupling gate contact structure 120. In one illustrative embodiment, the second mask ("Mask 2") may be used to form a plurality of features 140A-C, wherein the features 140B-C are a subset of the source/drain contact structures 118 for the overall circuit 100, and the feature 140A corresponds to a portion, but not all, of the cross-coupling gate contact structure 120. In one illustrative embodiment, the third mask ("Mask 3") may be used to form a plurality of features 150A-C, wherein the features 150B-C are a subset of the source/drain contact structures 118 for the overall circuit 100, and the feature 150A corresponds to a portion, but not all, of the cross-coupling gate contact structure 120. As depicted in FIG. 4A, the features 130G, 140A and 150A are sized and configured such that the opening in the patterned hard mask layer corresponding to the feature 130G overlaps the opening in the hard mask layer corresponding to the feature 140A, in the area indicated by the region 126, and overlaps the opening in the hard mask layer corresponding to the feature 150A, in the area indicated by the region 124. Due to this overlapping relationship, a continuous cross-coupling gate contact structure 120 may be formed in the patterned layer of insulating material so as to provide electrical connection between the two cross-coupled gate structures 114. As noted above, in the example shown in FIGS. 4A-4D, the formation of the cross-coupling gate contact structure 120 is accomplished by forming features corresponding to separate portions of the cross-coupling gate contact structure 120 in each of the three different masks. As before, by forming the overall cross-coupling gate contact structure 120 using features that are formed using the three masks used in the triple patterning process, the highly desirable cross-coupling gate contact structure 120 can be manufactured using triple patterning techniques.

FIG. 4B is a view depicting the features that may be formed using one illustrative example of Mask 1. As shown therein, the Mask 1 features 130A-F are a subset of the source/drain contact structures 118 for the overall circuit 100 and the feature 130G corresponds to a portion, but not all, of the overall cross-coupling gate contact structure 120. As long as the spacing 130S between the feature 130G and the nearest other feature formed using Mask 1, e.g., the features 130B and 130E, does not violate the minimum spacing rules for Mask 1, then the feature 130G may be formed using Mask 1. The feature 130G is sized such that it has a first overlap portion 130X1 that will overlap the opening formed in the hard mask layer using the feature 140A defined in Mask 2 and a second overlap portion 130X2 that will overlap the opening formed in the hard mask layer using the feature 150A defined in Mask 3.

FIG. 4C is a view depicting the features that may be formed using one illustrative example of Mask 2. As shown therein, the Mask 2 features 140B-C are a subset of the source/drain contact structures 118 for the overall circuit 100. As noted above, the Mask 2 feature 140A represents a portion of the cross-coupling gate contact structure 120. An opening corresponding to the feature 140A will be formed in the patterned hard mask layer. The feature 140A is sized such that it has an overlap portion 140X that will overlap the opening formed in the hard mask layer using the feature 130G defined in Mask 1. As long as the spacing 140S between the feature 140A and the nearest other feature formed using Mask 2, e.g., the feature 140C, does not violate the minimum spacing rules for Mask 2, then the feature 140A may be formed using Mask 2.

FIG. 4D is a view depicting the features that may be formed using one illustrative example of Mask 3. As shown therein, the Mask 3 features 150B-C are a subset of the source/drain contact structures 118 for the overall circuit 100. As noted above, the Mask 3 feature 150A represents a portion of the cross-coupling gate contact structure 120. An opening corresponding to the feature 150A will be formed in the patterned hard mask layer. The feature 150A is sized such that it has an overlap portion 150X that will overlap the opening formed in the hard mask layer using the feature 130G defined in Mask 1. As long as the spacing 150S between the feature 150A and the nearest other feature formed using Mask 3, e.g., the feature 150B, does not violate the minimum spacing rules for Mask 3, then the feature 150A may be formed using Mask 3.

Figure 5B:
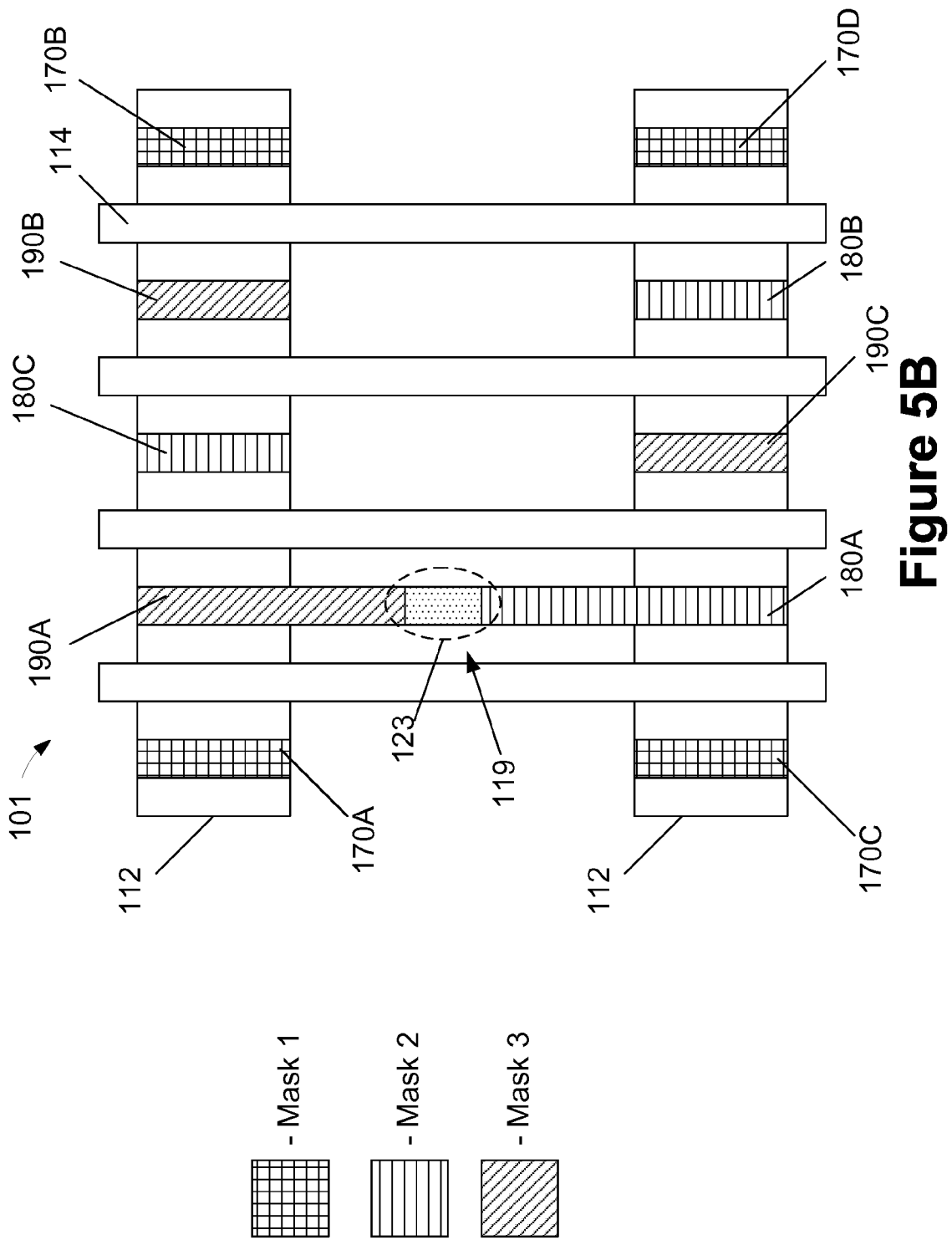

FIGS. 5A-5E depict another illustrative example wherein the methods disclosed herein may be used to form a pass-through contact structure 119 using the triple patterning techniques disclosed herein. FIG. 5A depicts a simplified example of an illustrative circuit 101 that includes an illustrative example of a pass-through contact structure 119 that may be formed using triple patterning techniques. Such pass-through contact structures are commonly employed in many circuit applications. In general, the circuit 101 is comprised of a plurality of transistor structures that are formed in and above the previously described spaced-apart regions 112 of the semiconductor substrate. The illustrative pass-through contact structure 119 spans across at least two of the isolated, spaced-apart regions 112 of the semiconductor substrate. The circuit 101 further includes a plurality of the previously described gate structures 114, a plurality of the previously described source/drain regions 116, a plurality of the previously described source/drain contact structures 118 and the illustrative pass-through contact structure 119. The pass-through contact structure 119 is so named because the pass-through contact structure 119 extends across both of the semiconductor regions 112. The source/drain contact structures 118 and the pass-through contact structure 119 are formed after the gate structures 114 and the source/drain regions 116 are formed. In general, the source/drain contact structures 118 and the pass-through contact structure 119 are formed at the device contact level, i.e., at a level below the so-called via zero (V0) that is formed to establish electrical contact between the device level contacts and the first general metal layer (so-called M1 layer) that is the first general wiring layer for the integrated circuit product.

Figure 5D:
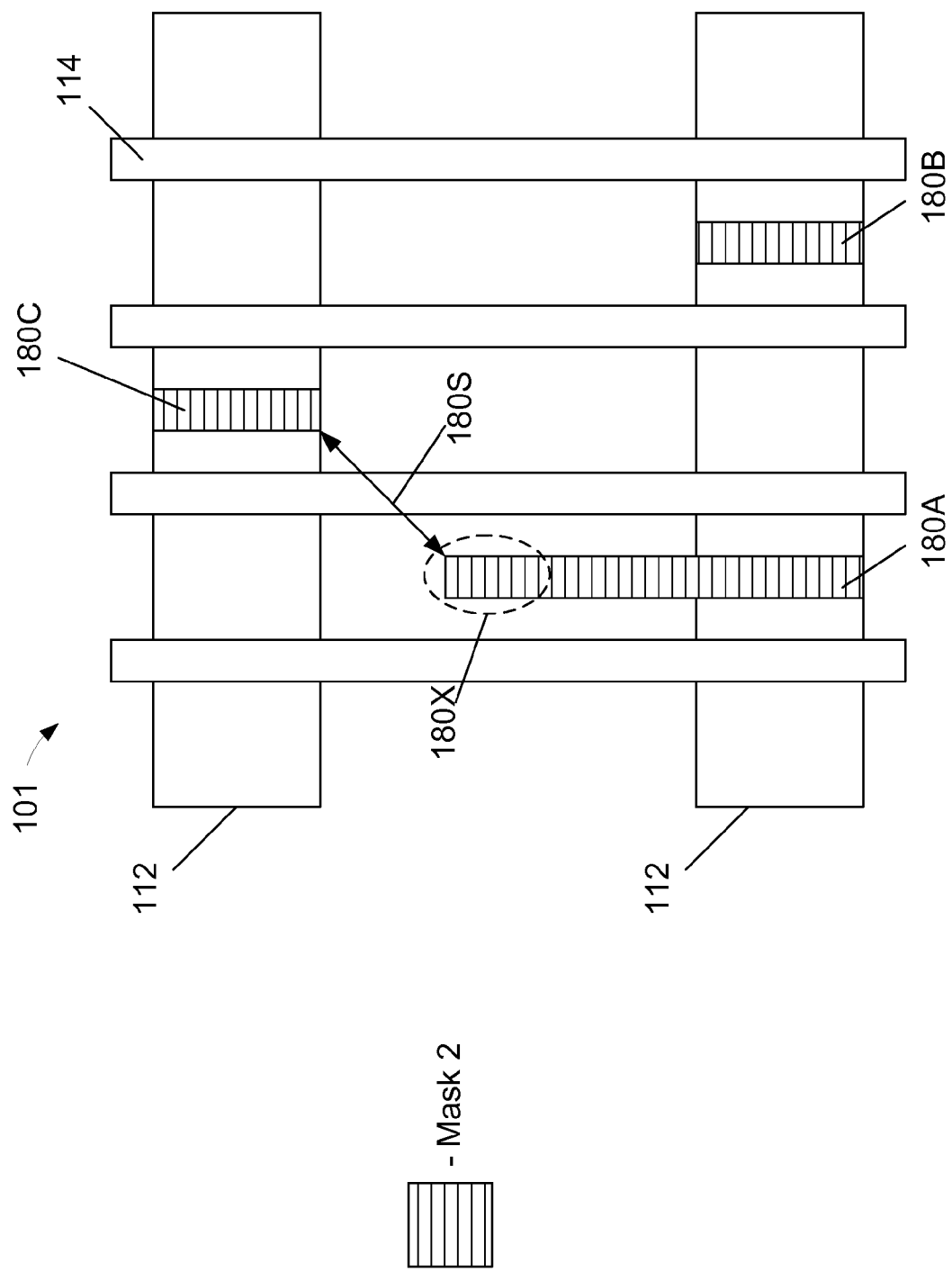
Figure 5E:
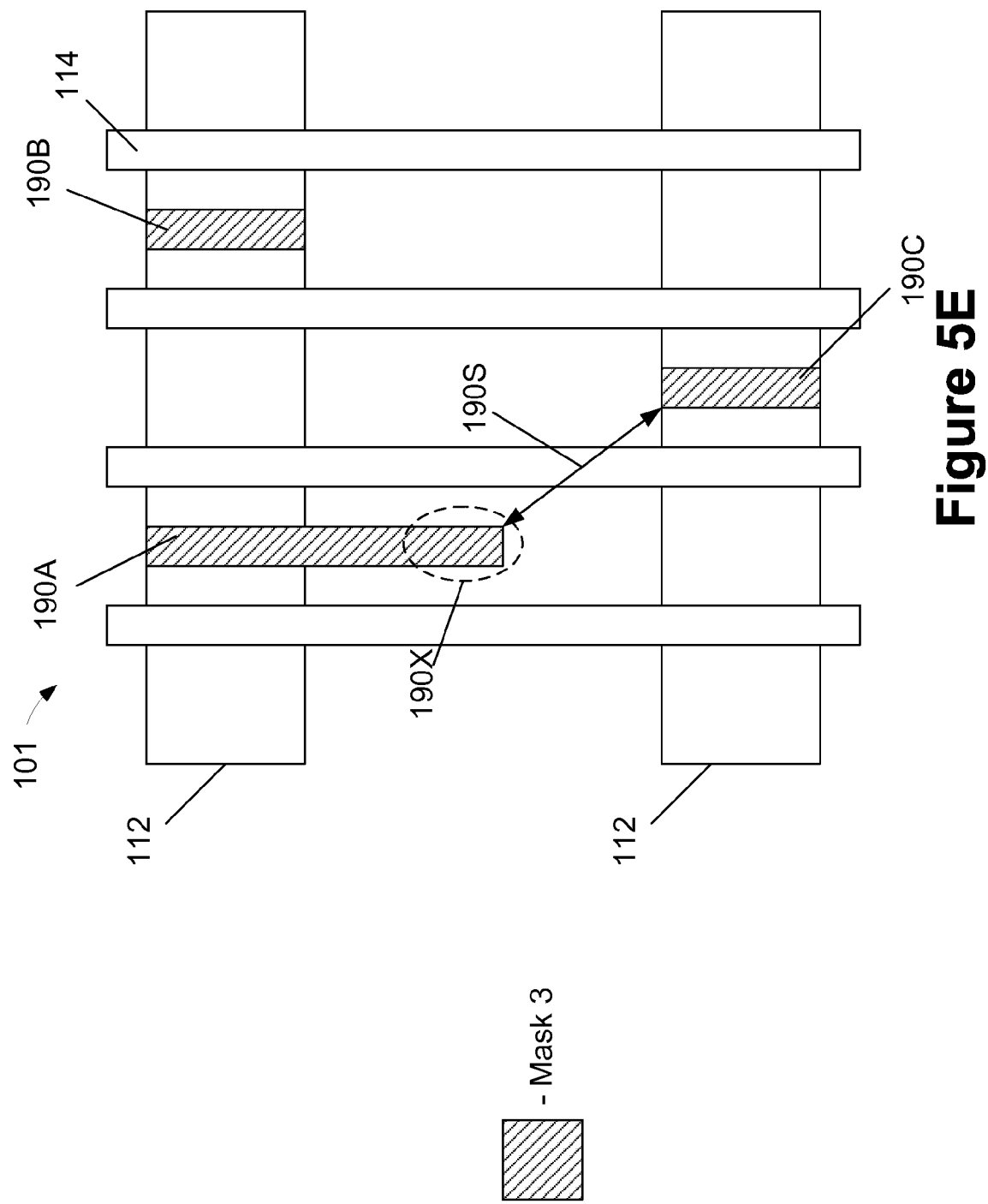

As noted above, fabricating the source/drain contact structures 118 and the pass-through contact structure 119 of the circuit 101 using a triple patterning process involves forming three photoresist etch masks and performing three etching processes to transfer the desired overall pattern of the source/drain contact structures 118 and the pass-through contact structure 119 to a hard mask layer that is then used as an etch mask to etch the desired features into an underlying layer of insulating material. In FIGS. 5B-5E, the three masks (1-3) are depicted with different shading to facilitate explanation. FIG. 5B depicts the features, i.e., openings that will be formed in the hard mask layer using all three masks, while FIGS. 5C, 5D and 5E are views of each of the features that will be formed in the hard mask layer using each of the individual masks 1-3, respectively.

With reference to FIG. 5B, in one illustrative embodiment, the first mask ("Mask 1") may be used to form a plurality of features 170A-D (a subset of the source/drain contact structures 118 for the overall circuit 101). In one illustrative embodiment, the second mask ("Mask 2") may be used to form a plurality of features 180A-C, wherein the features 180B-C are a subset of the source/drain contact structures 118 for the overall circuit 101, and the feature 180A corresponds to a portion of the pass-through contact structure 119. Importantly, the feature 180A corresponds to a portion, but not all, of the overall pass-through contact structure 119. In one illustrative embodiment, the third mask ("Mask 3") may be used to form a plurality of features 190A-C, wherein the features 190B-C are a subset of the source/drain contact structures 118 for the overall circuit 101, and the feature 190A corresponds to a portion, but not all, of the pass-through contact structure 119. As depicted in FIG. 5B, the features 180A and 190A are sized and configured such that, when the openings are formed in the patterned hard mask layer corresponding to these two features, they overlap one another, in the area indicated by the region 123. Due to this overlapping relationship, a continuous pass-through contact structure 119 may ultimately be formed in the patterned layer of insulating material. In the embodiment shown in FIGS. 5A-5E, the formation of the pass-through contact structure 119 is accomplished by forming features corresponding to separate portions of the pass-through contact structure 119 using two different masks. Of course, if desired, using the methods disclosed herein, the pass-through contact structure 119 could be manufactured by forming features corresponding to portions of the pass-through contact structure 119 using each of the three masks used during the triple patterning process, as described above with respect to the formation of the cross-coupling gate contact structure 120 shown in FIGS. 4A-4D. By forming the overall pass-through contact structure 119 using features that are formed using at least two of the three masks used in the triple patterning process, the highly desirable pass-through contact structure 119 can be manufactured using triple patterning techniques.

FIG. 5C is a view depicting the features that may be formed using one illustrative example of Mask 1. As shown therein, the Mask 1 features 170A-D are a subset of the source/drain contact structures 118 for the overall circuit 101. The spacing between the adjacent features shown in Mask 1 does not violate the minimum spacing rules for Mask 1.

FIG. 5D is a view depicting the features that may be formed using one illustrative example of Mask 2. As shown therein, the Mask 2 features 180B-C are a subset of the source/drain contact structures 118 for the overall circuit 101. As noted above, the Mask 2 feature 180A represents an opening that will be formed in the patterned hard mask layer. Importantly, the feature 180A corresponds to a portion, but not all, of the overall pass-through contact structure 119. The feature 180A is sized such that it has an overlap portion 180X that will overlap the opening formed in the hard mask layer using the feature 190A defined in Mask 3. As long as the spacing 180S between the feature 180A and the nearest other feature formed using Mask 2, e.g., the feature 180C, does not violate the minimum spacing rules for Mask 2, then the feature 180A may be formed using Mask 2.

FIG. 5E is a view depicting the features that will be formed using one illustrative example of Mask 3. As shown therein, the Mask 3 features 190B-C are a subset of the source/drain contact structures 118 for the overall circuit 101. As noted above, the Mask 3 feature 190A represents an opening that will be formed in the patterned hard mask layer. Importantly, the feature 190A corresponds to a portion, but not all, of the overall pass-through contact structure 119. The feature 190A is sized such that it has an overlap portion 190X that will overlap the opening formed in the patterned hard mask using the feature 180A defined in Mask 2. As long as the spacing 190S between the feature 190A and the nearest other feature formed using Mask 3, e.g., the feature 190C, does not violate the minimum spacing rules for Mask 3, then the feature 190A may be formed using Mask 3.

Using this technique, the contact features for the circuit 101, including the pass-through contact structure 119, may be formed using triple patterning techniques. Due to the overlap between the features 180A and 190A, the trench or opening that is ultimately formed in the underlying layer of insulating material is continuous in nature and may be filled with a conductive material so as to form the illustrative pass-through contact structure 119.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a cross-coupling gate contact structure for an integrated circuit product using triple patterning techniques, comprising:

forming a hard mask layer above a layer of insulating material;

patterning said hard mask layer using three patterned photoresist etch masks, wherein a first feature corresponding to a portion, but not all, of said cross-coupling gate contact structure is present in a first of said three patterned photoresist etch masks and a second feature corresponding to a portion, but not all, of said cross-coupling gate contact structure is present in a second of said three patterned photoresist etch masks;

after patterning said hard mask layer using said three patterned photoresist etch masks, patterning said layer of insulating material using said patterned hard mask layer as an etch mask so as to thereby form a trench in said layer of insulating material for said cross-coupling gate contact structure; and forming said cross-coupling gate contact structure in said trench.

2. The method of claim 1, wherein said cross-coupling gate contact structure is comprised of copper or tungsten.

3. The method of claim 1, wherein each of said three patterned photoresist etch masks includes individual features that each correspond to a source/drain contact structure for a transistor.

4. The method of claim 1, wherein said cross-coupling gate contact structure conductively couples two spaced-apart gate structures that are spaced apart by a dimension of 50 nm or less.

5. The method of claim 4, wherein said cross-coupling gate contact structure has a crossover portion that is oriented at an angle of about 45° relative to a long axis of one of said spaced-apart gate structures.

6. The method of claim 4, wherein said cross-coupling gate contact structure has a crossover portion that is oriented at an angle of about 90° relative to a long axis of one of said spaced-apart gate structures.

7. A method of forming a cross-coupling gate contact structure for an integrated circuit product using triple patterning techniques, comprising:

forming a hard mask layer above a layer of insulating material;

patterning said hard mask layer using three patterned photoresist etch masks, wherein a first feature corresponding to a portion, but not all, of said cross-coupling gate contact structure is present in a first of said three patterned photoresist etch masks, a second feature corresponding to a portion, but not all, of said cross-coupling gate contact structure is present in a second of said three patterned photoresist etch masks and a third feature corresponding to a portion, but not all, of said cross-coupling gate contact structure is present in a third of said three patterned photoresist etch masks;

after patterning said hard mask layer using said three patterned photoresist etch masks, patterning said layer of insulating material using said patterned hard mask layer as an etch mask so as to thereby form a trench in said layer of insulating material for said cross-coupling gate contact structure; and forming said cross-coupling gate contact structure in said trench.

8. The method of claim 7, wherein said cross-coupling gate contact structure is comprised of copper or tungsten.

9. The method of claim 7, wherein each of said three patterned photoresist etch masks includes individual features that each correspond to a source/drain contact structure for a transistor.

10. The method of claim 7, wherein said cross-coupling gate contact structure conductively couples two spaced-apart gate structures that are spaced apart by a dimension of 50 nm or less.

11. The method of claim 10, wherein said cross-coupling gate contact structure has a crossover portion that is oriented at an angle of about 45° relative to a long axis of one of said spaced-apart gate structures.

12. The method of claim 10, wherein said cross-coupling gate contact structure has a crossover portion that is oriented at an angle of about 90° relative to a long axis of one of said spaced-apart gate structures.

13. A method of forming a pass-through contact structure for an integrated circuit product using triple patterning techniques, comprising:

forming a hard mask layer above a layer of insulating material;

patterning said hard mask layer using three patterned photoresist etch masks, wherein a first feature corresponding to a portion, but not all, of said pass-through contact structure is present in a first of said three patterned photoresist etch masks and a second feature corresponding to a portion, but not all, of said pass-through contact structure is present in a second of said three patterned photoresist etch masks;

after patterning said hard mask layer using said three patterned photoresist etch masks, patterning said layer of insulating material using said patterned hard mask layer as an etch mask so as to thereby form a trench in said layer of insulating material for said pass-through contact structure, wherein said trench extends across at least two spaced-apart, isolated semiconductor regions; and forming said pass-through contact structure in said trench.

14. The method of claim 13, wherein said pass-through contact structure is comprised of copper or tungsten.

15. The method of claim 13, wherein each of said three patterned photoresist etch masks includes individual features that each correspond to a source/drain contact structure for a transistor.

16. The method of claim 13, wherein a third feature corresponding to a portion, but not all, of said pass-through contact structure is present in a third of said three patterned photoresist etch masks.

17. The method of claim 1, wherein the first feature and the second feature partially overlap a common portion of the hard mask layer.

18. The method of claim 7, wherein at least two of the first, second, and third features partially overlap a common portion of the hard mask layer.

19. The method of claim 13, wherein the first feature and the second feature partially overlap a common portion of the hard mask layer.

* * * * *